US009015568B2

(12) United States Patent
Henige

(10) Patent No.: US 9,015,568 B2
(45) Date of Patent: Apr. 21, 2015

(54) SYSTEM AND METHOD FOR MULTI-STAGE TIME-DIVISION MULTIPLEXED LDPC DECODER

(71) Applicant: Samsung Electronics Co., Ltd, Suwon-si, Gyeonggi-do (KR)

(72) Inventor: Thomas Michael Henige, Plano, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 86 days.

(21) Appl. No.: 13/787,342

(22) Filed: Mar. 6, 2013

(65) Prior Publication Data

US 2013/0275838 A1 Oct. 17, 2013

Related U.S. Application Data

(60) Provisional application No. 61/623,448, filed on Apr. 12, 2012.

(51) Int. Cl.
| | | |
|---|---|---|
| *H03M 13/00* | (2006.01) | |
| *H03M 13/11* | (2006.01) | |
| *H03M 13/13* | (2006.01) | |

(52) U.S. Cl.
CPC .......... *H03M 13/1145* (2013.01); *H03M 13/13* (2013.01); *H03M 13/1111* (2013.01); *H03M 13/1117* (2013.01); *H03M 13/1134* (2013.01); *H03M 13/114* (2013.01)

(58) Field of Classification Search
CPC .......... H03M 13/114; H03M 13/1134; H03M 13/1145; H03M 13/1111; H04L 1/005; H04L 1/0631

USPC .................. 714/752, 784, 786, 800–801, 810
See application file for complete search history.

(56) References Cited

U.S. PATENT DOCUMENTS

| | | | |
|---|---|---|---|
| 7,724,163 B2 * | 5/2010 | Wong et al. | 341/81 |
| 8,108,762 B2 * | 1/2012 | Liu et al. | 714/801 |
| 8,136,008 B1 * | 3/2012 | Yeung et al. | 714/755 |
| 8,347,195 B1 * | 1/2013 | Varnica et al. | 714/785 |
| 8,359,522 B2 * | 1/2013 | Gunnam et al. | 714/758 |
| 2008/0304576 A1 | 12/2008 | Dabiri et al. | |
| 2009/0037799 A1 | 2/2009 | Liu et al. | |
| 2009/0106622 A1 | 4/2009 | Yokokawa et al. | |
| 2011/0179337 A1 | 7/2011 | Chen et al. | |

OTHER PUBLICATIONS

International Search Report dated Jul. 18, 2013 in connection with International Patent Application No. PCT/KR2013/003058, 3 pages.
Written Opinion of International Searching Authority dated Jul. 18, 2013 in connection with International Patent Application No. PCT/KR2013/003058, 5 pages.

* cited by examiner

*Primary Examiner* — Shelly A Chase

(57) ABSTRACT

A low density parity check decoder includes a decoding process divided into two or more processing stages arranged in series. At one time, each processing stage processes a different code block than each other processing stage in the series. The decoder is capable of simultaneously decoding as many code blocks as stages. A controller passes the code blocks between the processing stages at the proper time and in the proper sequence. The controller passes the code blocks through the series of stages in a time-division multiplexed fashion.

23 Claims, 12 Drawing Sheets

SYSTEM AND METHOD FOR MULTI-STAGE TIME-DIVISION MULTIPLEXED LDPC DECODER

CROSS-REFERENCE TO RELATED APPLICATION AND CLAIM OF PRIORITY

The present application claims priority to U.S. Provisional Patent Application Ser. No. 61/623,448, filed Apr. 12, 2012, entitled "MULTI-STAGE TIME-DIVISION MULTIPLEXED LDPC DECODER." The content of the above-identified patent documents is incorporated herein by reference.

TECHNICAL FIELD

The present application relates generally to decoding systems and, more specifically, to multi-stage time-division multiplexed low density parity check (LDPC) decoding.

BACKGROUND

Forward Error Correction (FEC) is used in many communications and electronic systems to increase the reliability of data storage and transmission. At the data source, such as at the transmitting device, a parity check information is added to the original information to create code words with built-in error detection and error correction information. The resulting code words are either transmitted for immediate use or stored for later use, for example, use by the data sink or receiving device. Code words received by the receiving device may be corrupted by noise, erasure, or other errors. The receiver performs a decoding process on the received code words in order to detect and correct errors, and to extract the original information.

LDPC coding is one method of forward error correction used in modern communication and information systems. This is due to the high throughput, performance approaching channel capacity, and hardware-friendliness. Practical implementations of LDPC decoders use iterative decoding methods. Various scheduling methods exist for updating the variable nodes and check nodes, including flooding schedules and layered schedules.

SUMMARY

A decoder including an iterative pipeline low density parity check (LDPC) decoding process is provided. The decoder includes an input terminal configured to receive at least one code block. The decoder includes an input buffer memory configured to store the at least one code block. The decoder also includes processing circuitry. The processing circuitry includes multiple LDPC decoding stages. Each LDPC decoding stage is configured to implement a respective portion of an LDPC decoding process. The processing circuitry is configured to receive the at least one code block from the input buffer memory. The processing circuitry is also configured to process S code blocks concurrently and sequence the S code blocks through the plurality of LDPC decoding stages. A first LDPC decoding stage is configured to process a first code block during a first time period and a second code block during a second time period and a second LDPC decoding stage is configured to process the first code block during the second time period.

A multi-stage time-division multiplexed (MSTDM) low density parity check (LDPC) decoder is provided. The MSTDM decoder includes an input terminal configured to receive at least one code block. The input buffer memory is configured to store the at least one code block. The MSTDM decoder includes a working memory configured to store the at least one decoding iteration of the at least one code block. The MSTDM decoder includes processing circuitry, which includes multiple LDPC decoding stages in a series. Each stage is configured to implement one or more respective decoding steps, the processing circuitry configured to process S code blocks concurrently and sequence the S code blocks through the S LDPC decoding stages per iteration in a time-division multiplexed (TDM) manner. A first LDPC decoding stage is configured to process a first code block during a first time period and a second code block during a second time period and a second LDPC decoding stage is configured to process the first code block during the second time period.

A method of decoding a low density parity check (LDPC) encoded code block is provided. The method includes receiving one or more code blocks from a channel. The method includes storing the code blocks in an input buffer memory. The method includes sequencing, by processing circuitry, the code blocks through a series of S LDPC decoding stages. A first LDPC decoding stage is configured to process a first code block during a first time period and a second code block during a second time period and a second LDPC decoding stage is configured to process the first code block during the second time period. The method includes storing decoded iterations of at least one code block in a register between two stages.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged data processing system.

According to embodiments of the present disclosure, a low density parity check (LDPC) decoder includes a decoding process separated into two or more processing stages. Each processing stage operates concurrently on a different code block. Code blocks pass through the processing stages in the proper sequence and with the proper timing so that the cumulative processing on each code block is the same as with a single-stage decoder operating on a single code block. In certain embodiments, the decoder includes a multiplexer, and the code blocks pass through the multiple processing stages in a time-multiplexed fashion.

Embodiments of the present disclosure provide an improvement to existing LDPC decoder architectures (whether layered, flooding, fully- or partially-parallel, and the like), which significantly improves decoder throughput with minimal increases in hardware size. The architecture of the LDPC decoding function is divided into stages, with each stage processing a different code block in a time-multiplexed fashion.

Figure 1:
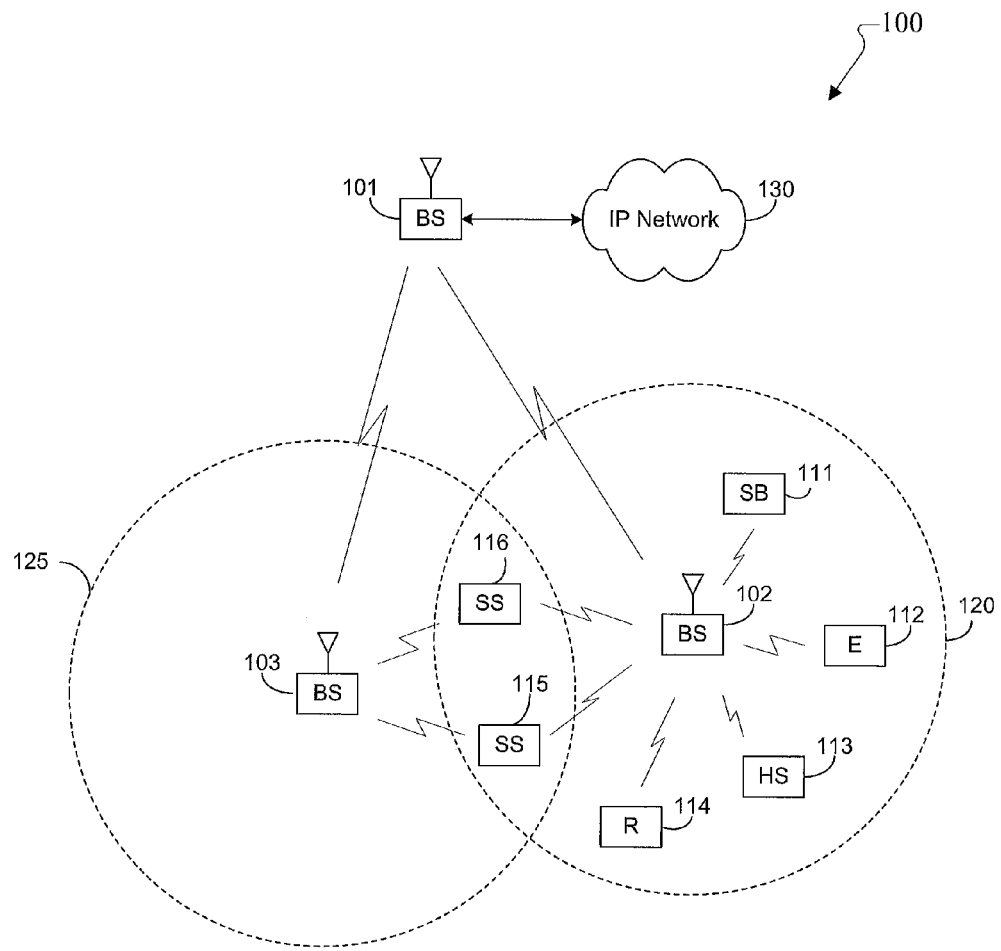
FIG. 1 illustrates a wireless network according to embodiments of the present disclosure.

FIG. 1 illustrates a wireless network 100 according to one embodiment of the present disclosure. The embodiment of wireless network 100 illustrated in FIG. 1 is for illustration only. Other embodiments of wireless network 100 could be used without departing from the scope of this disclosure.

The wireless network 100 includes base station (BS) 101, BS 102, and BS 103. The BS 101 communicates with BS 102 and BS 103. The BS 101 also communicates with Internet protocol (IP) network 130, such as the Internet, a proprietary IP network, or other data network.

Depending on the network type, other well-known terms may be used instead of "base station," such as "access point". For the sake of convenience, the term "base station" shall be used herein to refer to the network infrastructure components that provide wireless access to remote terminals. In addition, the term user equipment (UE) is used herein to refer to remote terminals that can be used by a consumer to access services via the wireless communications network. Other well-known terms for the remote terminals include "mobile stations" and "subscriber stations."

The BS 102 provides wireless broadband access to network 130 to a first plurality of user equipments (UEs) within coverage area 120 of BS 102. The first plurality of UEs includes UE 111, which may be located in a small business; UE 112, which may be located in an enterprise; UE 113, which may be located in a WiFi hotspot; UE 114, which may be located in a first residence; UE 115, which may be located in a second residence; and UE 116, which may be a mobile device, such as a cell phone, a wireless laptop, a wireless PDA, or the like. UEs 111-116 may be any wireless communication device, such as, but not limited to, a mobile phone, mobile PDA and any mobile station (MS).

For the sake of convenience, the term "user equipment" or "UE" is used herein to designate any remote wireless equipment that wirelessly accesses a BS, whether the UE is a mobile device (e.g., cell phone) or is normally considered a stationary device (e.g., desktop personal computer, vending machine, etc.). In other systems, other well-known terms may be used instead of "user equipment", such as "mobile station" (MS), "subscriber station" (SS), "remote terminal" (RT), "wireless terminal" (WT), and the like.

The BS 103 provides wireless broadband access to a second plurality of UEs within coverage area 125 of BS 103. The second plurality of UEs includes UE 115 and UE 116. In some embodiments, one or more of BSs 101-103 may communicate with each other and with UEs 111-116 using wireless communication techniques including techniques for: multi-stage time-division multiplexed LDPC decoding described in embodiments of the present disclosure.

Dotted lines show the approximate extents of coverage areas 120 and 125, which are shown as approximately circular for the purposes of illustration and explanation only. It should be clearly understood that the coverage areas associated with base stations, for example, coverage areas 120 and 125, may have other shapes, including irregular shapes, depending upon the configuration of the base stations and variations in the radio environment associated with natural and man-made obstructions.

Although FIG. 1 depicts one example of a wireless network 100, various changes may be made to FIG. 1. For example, another type of data network, such as a wired network, may be substituted for wireless network 100. In a wired network, network terminals may replace BSs 101-103 and UEs 111-116. Wired connections may replace the wireless connections depicted in FIG. 1.

Figure 2A:
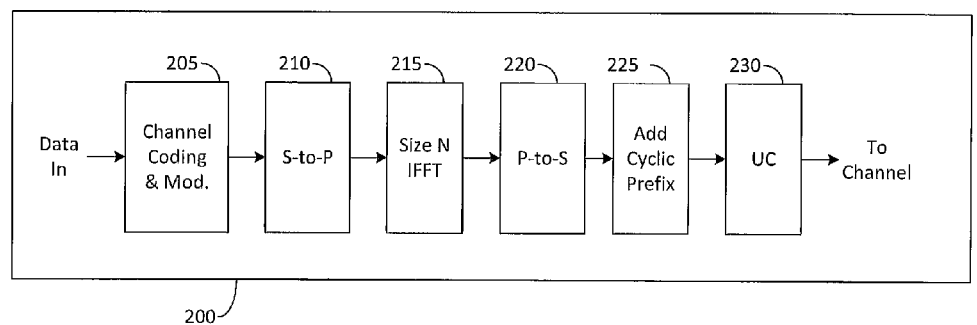
FIG. 2A illustrates a high-level diagram of a wireless transmit path according to embodiments of the present disclosure.
Figure 2B:
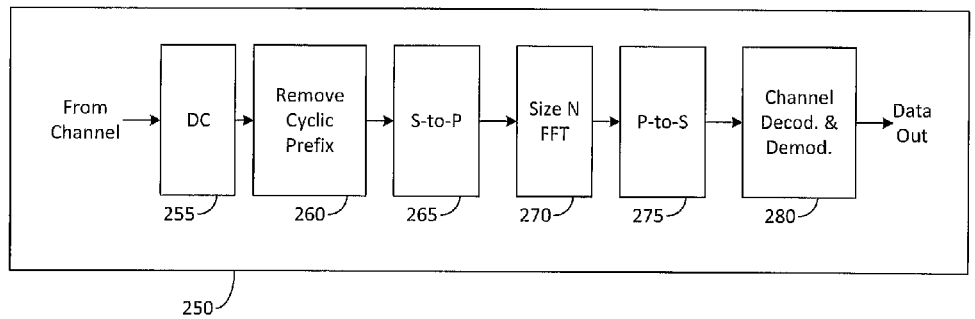
FIG. 2B illustrates a high-level diagram of a wireless receive path according to embodiments of the present disclosure.

FIG. 2A is a high-level diagram of a wireless transmit path. FIG. 2B is a high-level diagram of a wireless receive path. In FIGS. 2A and 2B, the transmit path 200 may be implemented, e.g., in BS 102 and the receive path 250 may be implemented, e.g., in a UE, such as UE 116 of FIG. 1. It will be understood, however, that the receive path 250 could be implemented in a BS (e.g. BS 102 of FIG. 1) and the transmit path 200 could be implemented in a US. In certain embodiments, transmit path 200 and receive path 250 are configured to perform methods for multi-stage time-division multiplexed LDPC decoding described in embodiments of the present disclosure.

Transmit path 200 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. Receive path 250 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2A and 2B may be implemented in software while other components may be implemented by configurable hardware (e.g., a processor) or a mixture of software and configurable hardware.

In transmit path 200, channel coding and modulation block 205 receives a set of information bits, applies coding (e.g., LDPC coding) and modulates (e.g., Quadrature Phase Shift Keying (QPSK) or Quadrature Amplitude Modulation (QAM)) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and UE 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at UE 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes the modulated symbols to recover the original input data stream.

Each of BSs 101-103 may implement a transmit path that is analogous to transmitting in the downlink to UEs 111-116 and may implement a receive path that is analogous to receiving in the uplink from UEs 111-116. Similarly, each one of UEs 111-116 may implement a transmit path corresponding to the architecture for transmitting in the uplink to BSs 101-103 and may implement a receive path corresponding to the architecture for receiving in the downlink from BSs 101-103.

Figure 3:
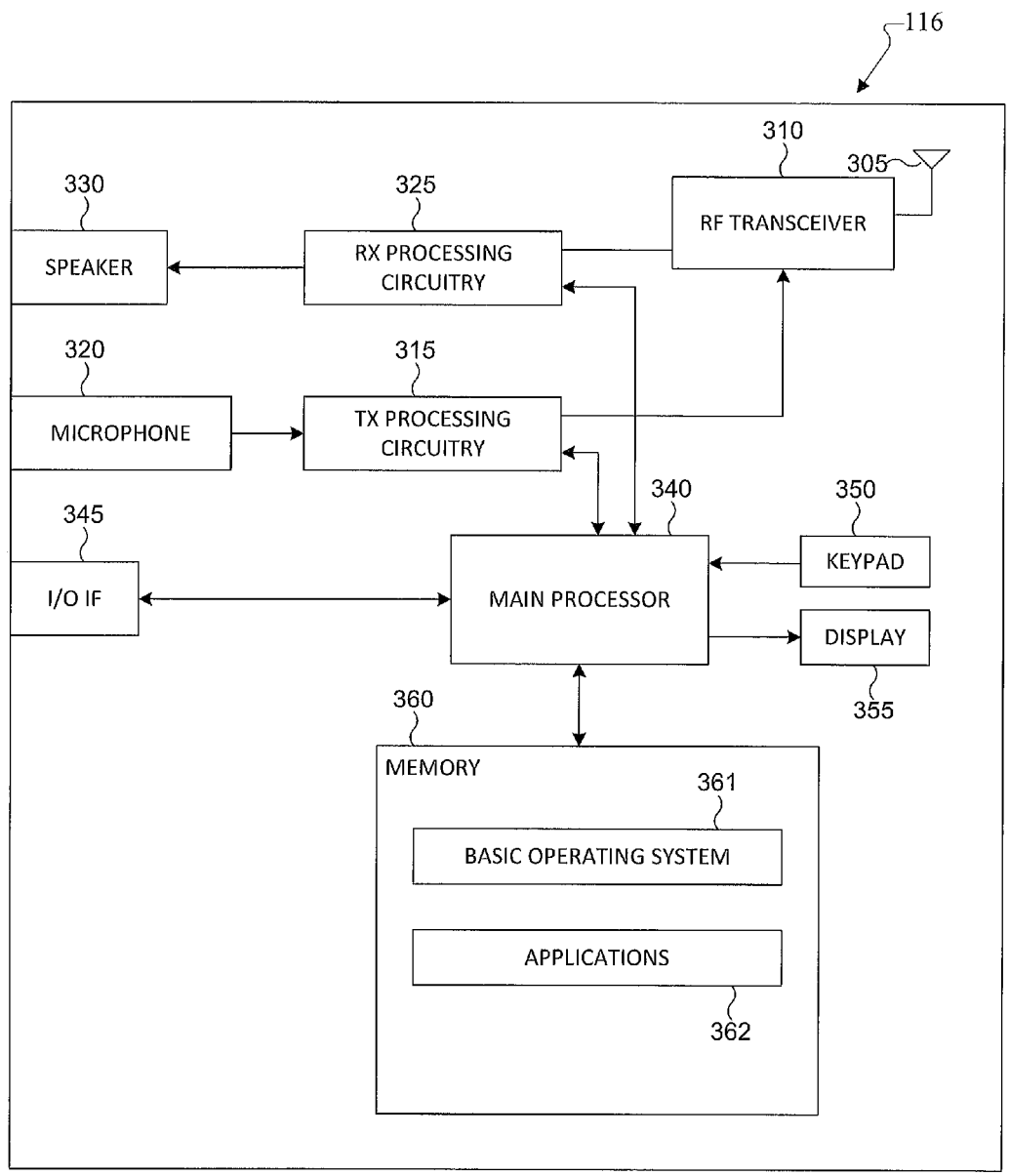
FIG. 3 illustrates a subscriber station according to embodiments of the present disclosure.

FIG. 3 illustrates a subscriber station according to embodiments of the present disclosure. The embodiment of subscriber station, such as UE 116, illustrated in FIG. 3 is for illustration only. Other embodiments of the wireless subscriber station could be used without departing from the scope of this disclosure.

UE 116 comprises antenna 305, radio frequency (RF) transceiver 310, transmit (TX) processing circuitry 315, microphone 320, and receive (RX) processing circuitry 325. SS 116 also comprises speaker 330, main processor 340, input/output (I/O) interface (IF) 345, keypad 350, display 355, and memory 360. Memory 360 further comprises basic operating system (OS) program 361 and a plurality of applications 362.

Radio frequency (RF) transceiver 310 receives from antenna 305 an incoming RF signal transmitted by a base station of wireless network 100. Radio frequency (RF) transceiver 310 down-converts the incoming RF signal to produce an intermediate frequency (IF) or a baseband signal. The IF or baseband signal is sent to receiver (RX) processing circuitry 325 that produces a processed baseband signal by filtering, decoding, and/or digitizing the baseband or IF signal. Receiver (RX) processing circuitry 325 transmits the processed baseband signal to speaker 330 (i.e., voice data) or to main processor 340 for further processing (e.g., web browsing).

Transmitter (TX) processing circuitry 315 receives analog or digital voice data from microphone 320 or other outgoing baseband data (e.g., web data, e-mail, interactive video game data) from main processor 340. Transmitter (TX) processing circuitry 315 encodes, multiplexes, and/or digitizes the outgoing baseband data to produce a processed baseband or IF signal. Radio frequency (RF) transceiver 310 receives the outgoing processed baseband or IF signal from transmitter (TX) processing circuitry 315. Radio frequency (RF) transceiver 310 up-converts the baseband or IF signal to a radio frequency (RF) signal that is transmitted via antenna 305.

In certain embodiments, main processor 340 is a microprocessor or microcontroller. Memory 360 is coupled to main processor 340. According to some embodiments of the present disclosure, part of memory 360 comprises a random access memory (RAM) and another part of memory 360 comprises a Flash memory, which acts as a read-only memory (ROM).

Main processor 340 executes basic operating system (OS) program 361 stored in memory 360 in order to control the overall operation of wireless subscriber station 116. In one such operation, main processor 340 controls the reception of forward channel signals and the transmission of reverse channel signals by radio frequency (RF) transceiver 310, receiver (RX) processing circuitry 325, and transmitter (TX) processing circuitry 315, in accordance with well-known principles.

Main processor 340 is capable of executing other processes and programs resident in memory 360, such as multi-stage time-division multiplexed LDPC decoding processes described in embodiments of the present disclosure. Main processor 340 can move data into or out of memory 360, as required by an executing process. In some embodiments, the main processor 340 is configured to execute a plurality of applications 362, such as applications for coordinated multi-point (COMP) communications and multi-user multiple-input and multiple-output (MU-MIMO) communications. The main processor 340 can operate the plurality of applications 362 based on OS program 361 or in response to a signal received from BS 102. Main processor 340 is also coupled to I/O interface 345. I/O interface 345 provides subscriber station 116 with the ability to connect to other devices such as laptop computers and handheld computers. I/O interface 345 is the communication path between these accessories and main processor 340.

Main processor 340 is also coupled to keypad 350 and display unit 355. The operator of subscriber station 116 uses keypad 350 to enter data into subscriber station 116. Display 355 may be a liquid crystal display capable of rendering text and/or at least limited graphics from web sites. Alternate embodiments may use other types of displays.

Figure 4:
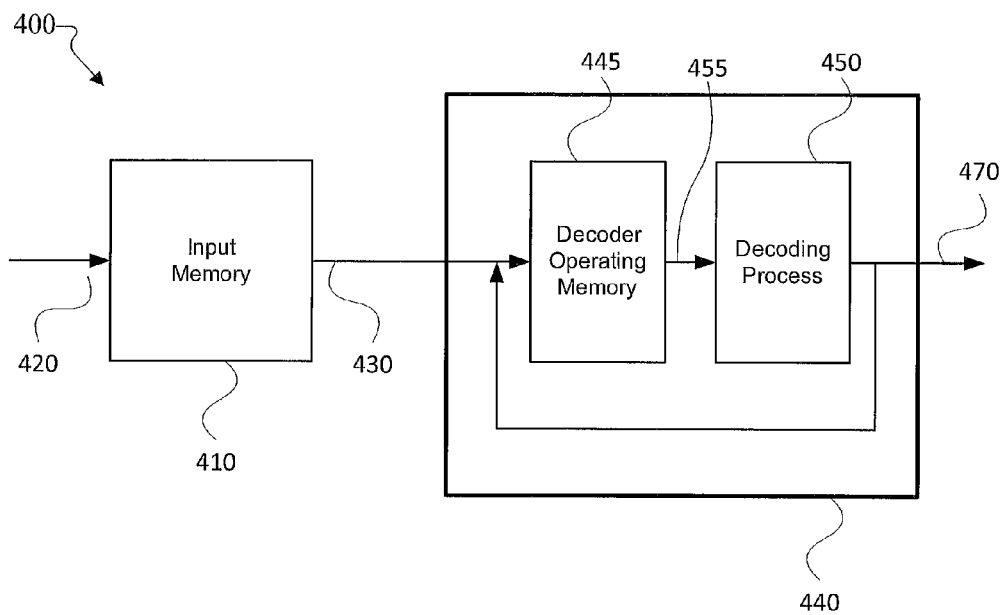
FIG. 4 illustrates a flow diagram within a receiving device according to embodiments of the present disclosure.

FIG. 4 illustrates a flow diagram within a receiving device according to embodiments of the present disclosure. The embodiment of the receiving device 400 shown in FIG. 4 is for illustration only. Other embodiments could be used without departing from the scope of this disclosure.

The receiving device 400 includes an input memory 410 (also referenced as an "input buffer") coupled to a decoder 440. The input memory 410 includes an input terminal 420 for receiving code block. The input memory 410 includes an output terminal 430 for transmitting the code block to the decoder 440.

The decoder 440 includes a decoder operating memory 445 coupled to decoding processing circuitry 450. The decoding processing circuitry 450 is configured to perform a decoding process. The decoder operating memory 445 receives the code block from the input memory 410. The decoder operating memory 445 sends the code block to the decoding processing circuitry 450. When the code block is partially decoded, the decoding processing circuitry 450 feeds back the partially decoded code block to the decoder operating memory 445 to commence another iteration of the decoding process. When the code block is fully decoded, the decoding process 450 outputs the fully decoded code block via output terminal 470.

Figure 5:
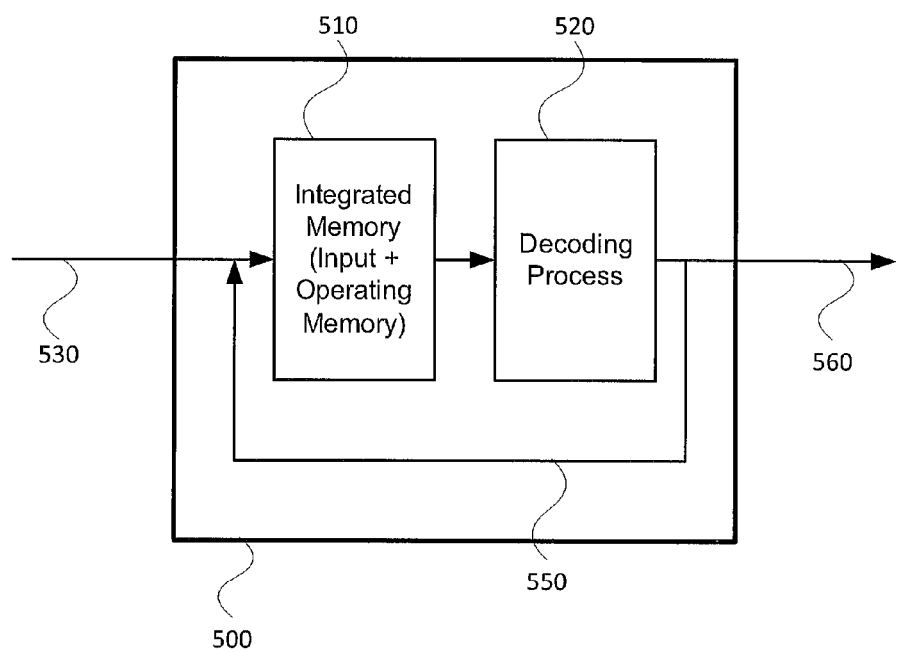
FIG. 5 illustrates a flow diagram within a decoder according to embodiments of the present disclosure.

FIG. 5 illustrates a flow diagram within a decoder 500 according to an exemplary embodiment of this disclosure. The embodiment of the decoder 500 shown in FIG. 5 is for illustration only. Other embodiments could be used without departing from the scope of this disclosure.

The decoder 500 includes an integrated memory 510 coupled to a decoding processing circuitry 520. The integrated memory 510 includes input and an operating memory. The decoding processing circuitry 520 is configured to perform a decoding process. The decoding processing circuitry 520 can be similar to, or the same as, the decoding processing circuitry 450. In certain embodiments, the amount of hardware required for the decoding process is decreased, and the size of the decoding device can be decreased by integrating the input memory and operating memory. The integrated memory 510 includes an input terminal for receiving encoded code blocks. The integrated memory 510 forwards the code block to the decoding processing circuitry 520.

The decoding processing circuitry 520 receives the code block from an output terminal of the integrated memory 510. When the code block is partially decoded, the decoding processing circuitry 520 feeds back the partially decoded code block to the integrated memory 510. When the code block is fully decoded, the decoding processing circuitry 520 outputs the fully decoded code block via an output terminal 560.

Figure 6:
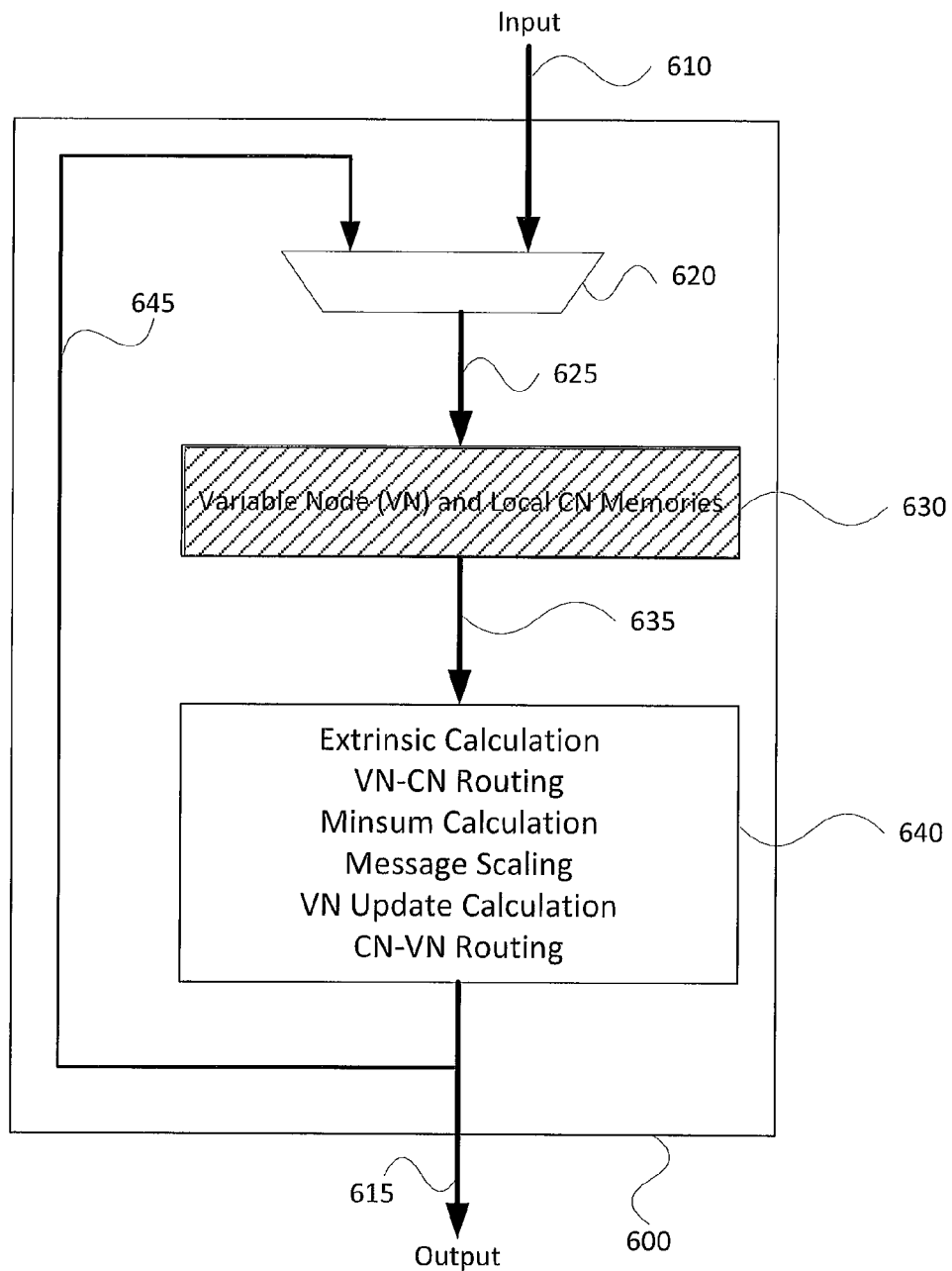
FIG. 6 illustrates a decoder implementing a decoding process according to embodiments of the present disclosure.

FIG. 6 illustrates a decoder 600 implementing an iterative decoding process. The embodiment of the decoder 600 shown in FIG. 6 is for illustration only. Other embodiments could be used without departing from the scope of this disclosure.

The decoder 600 includes an input terminal 610 for receiving encoded information and includes an output terminal 615 for sending decoded information. The decoder 600 includes a multiplexer 620, memory elements 630 and decoding processing circuitry 640. The multiplexer 620 is configured to receive the input block of encoded information and feedback information 645 (e.g., information from a previous iterative cycle of decoding). The decoding processing circuitry 640 is configured to perform a decoding process including extrinsic calculation, VN-CN routing, minsum calculation, message scaling, VN update calculation, CN-VN routing, and so forth.

In certain embodiments, the decoder 600 performs a flooding decoding process. In certain embodiments, the decoder 600 performs a layered decoding process.

Practical implementations of LDPC decoders use an iterative decoding process involving feedback. During each iteration, several steps occur. For example, six steps occur within the decoder 600: 1) Extrinsic Calculation; 2) VN-CN Routing; 3) Minsum Calculation; 4) Message Scaling; 5) VN Update Calculation; and 6) CN-VN Routing. These six steps are typical processes performed by a decoder, but are not necessarily an exhaustive or fully detailed list of the possible processes (also referred to as steps) the decoder can include. During these six steps, Variable Node (VN) data is accessed and modified as needed to connect to the Check Nodes (CN) and to calculate extrinsic values. Each CN calculates messages for all of the VNs connected to that CN. The CN messages are typically scaled or adjusted with an offset, and then may have to be routed or permuted to connect back to the appropriate VNs. Updated VN values are calculated using the new CN messages combined with extrinsic information. And finally, the updated VN values are stored for use in later decoding iterations. The updated variable node (VN) and Local check node (CN) information from previous iterations is used during the current iteration. This means that VNs must be updated before the next set of CNs is processed. All of the steps for each iteration must be completed before the next layer or iteration can proceed. To simplify the diagram, many of the combinatorial functions for the several steps have been grouped into a single block for decoding processing circuitry 640.

Figure 7:
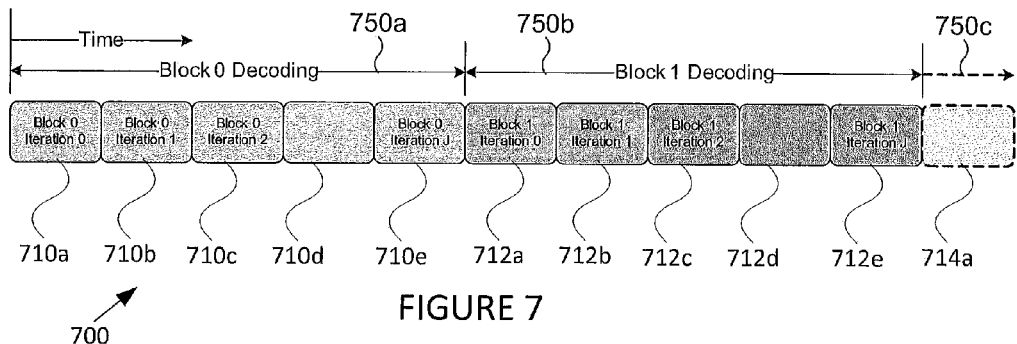
FIG. 7 illustrates a single cycle iterative processing schedule of a flooding decoder according to embodiments of the present disclosure.

FIG. 7 illustrates a single cycle iterative processing schedule 700 of a flooding decoder. The embodiment of the single cycle iterative schedule 700 shown in FIG. 7 is for illustration only. Other embodiments could be used without departing from the scope of this disclosure.

Decoder 600 can be a flooding decoder that performs a flooding decoding process such as the single cycle iterative processing schedule 700. The flooding decoder processes all parity checks represented by the code matrix (also referred to as the H-matrix), and then updates all VNs with the CN message information from all connected parity checks. This update schedule is known as the flooding schedule. The flooding decoder processing can occur in one or more clock cycles. Each block of time 710a-710e, 712a-712e and 714 on the horizontal axis represents the time to process one decoding iteration. Depending on the decoder design, each block of time on the flooding schedule represents a single clock cycle or multiple clock cycles. The flooding decoder process can produce a very high throughput if all the parity checks are performed in parallel, and subsequently all of the VN updates are performed in parallel. However, the flooding decoder process results in a very large and complex decoder design.

For example, during the time period of Block 0 Decoding 750a, the flooding decoder 600 performs an iterative decoding process on code block 0. During block 710a, the flooding decoder 600 performs a first iteration (Iteration 0) on the code block 0. During block 710b, the flooding decoder 600 performs a second iteration (Iteration 1) on the code block 0. During block 710c, the flooding decoder 600 performs a third iteration (Iteration 2) on the code block 0. Block 710d represents the fourth through penultimate iterations of decoding processing of block 0. Ultimately, during block 710e, the flooding decoder 600 performs a last iteration (Iteration J) on the code block 0. That is, all of the iterations 710a-710e performed for the decoding process of code block 0 take place during Block 0 Decoding 750a.

After the decoding process is complete for Block 0, the decoder 600 commences Block 1 Decoding 750*b*. During the time period of Block 1 Decoding 750*b*, the flooding decoder 600 performs an iterative decoding process on code block 1. During block 712*a*, the flooding decoder 600 performs a first iteration (Iteration 0) on the code block 1. During block 712*b*, the flooding decoder 600 performs a second iteration (Iteration 1) on the code block 1. During block 712*c*, the flooding decoder 600 performs a third iteration (Iteration 2) on code block 1. Block 712*d* represents the fourth through penultimate iterations of decoding processing of block 1. Ultimately, during block 712*e*, the flooding decoder 600 performs a last iteration (Iteration J) on the code block 1. That is, all of the iterations 712*a*-712*e* performed for the decoding process of code block 1 take place during Block 1 Decoding 750*b*.

Next, during Block 2 Decoding period 750*c*, the decoder 600 performs a flooding decoding process on a third code block, Block 2, and sequentially for other subsequent code blocks. The single cycle iterative processing schedule 700 for Block 2 begins with block 714*a*.

Figure 8:
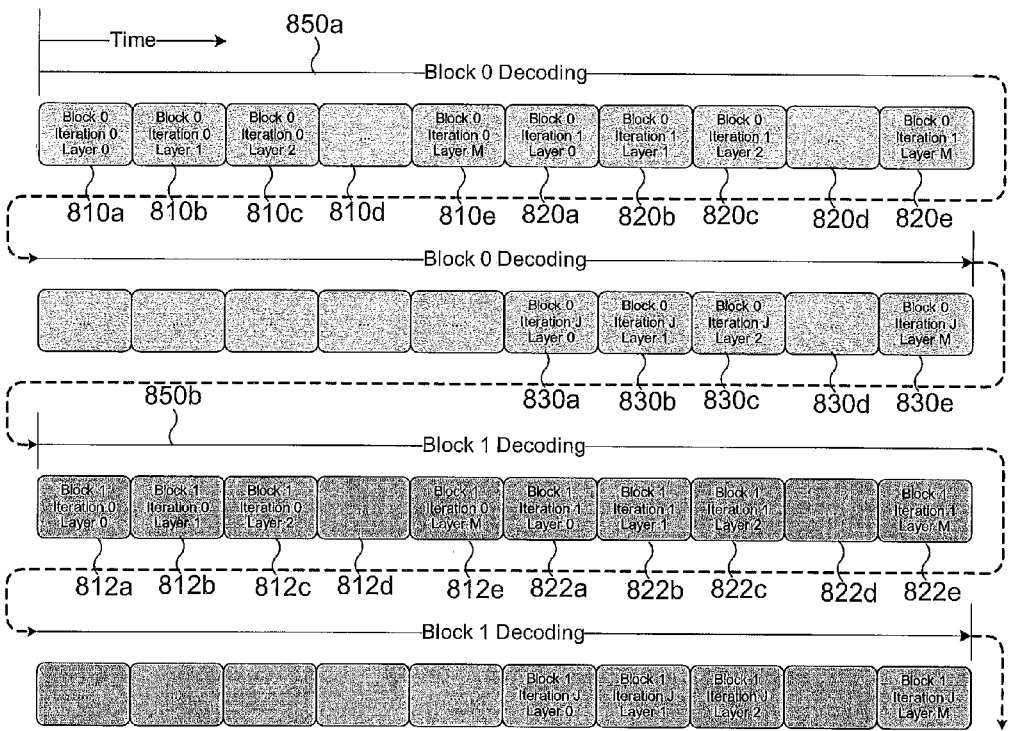
FIG. 8 illustrates a single cycle iterative processing schedule of a layered decoder according to embodiments of the present disclosure.

FIG. 8 illustrates a single cycle iterative processing schedule 800 of a layered decoder. The embodiment of the single cycle iterative schedule 800 shown in FIG. 8 is for illustration only. Other embodiments could be used without departing from the scope of this disclosure.

Decoder 600 can be a layered decoder that performs layered decoding process, such as the single cycle iterative processing schedule 800. The layered decoder processes one layer of the H-matrix, where a layer consists of Z parity checks, represented by one row of the base H-matrix.

Accordingly, a layer is a subset of the complete set of parity checks. In the layered process, only the Z parity checks within one H-matrix layer are processed in parallel, and then only the VNs connected to those parity checks are updated. Subsequent layers of the H-matrix are similarly processed one-by-one in order, until all parity checks have been processed. One pass through all the parity checks marks the completion of one iteration. Subsequent iterations through the parity checks can be performed to improve decoding reliability and performance. This update schedule is known as the layered update schedule. Each block of time on the horizontal axis represents the time to process one layer of the H-matrix. This could be one or more clock cycles, however to achieve high throughput it is preferable to perform this processing in a single cycle. A decoder based on the layered decoding method has several characteristics. Since each iteration takes multiple processing cycles, in most cases the layered decoder will have a much lower throughput than a flooding decoder. However, it will also have a proportionally smaller size than the flooding decoder. Properly designed, this type of decoder has a better throughput per unit area or per unit of power than a flooding decoder. This is due to the fact that the layered decoder converges in fewer iterations, since each processing layer benefits from updated VN information from previous layers.

For example, during the time period of Block 0 Decoding 850*a*, the layered decoder 600 performs in iterative decoding process on code block 0. During block 810*a*, the layered decoder 600 performs a first iteration (Iteration 0) of the H-matrix Layer 0 parity checks on the first code block, Block 0. During block 810*b*, the layered decoder 600 performs a first iteration (Iteration 0) of the second layer (Layer 1) of the H-matrix parity checks on the first code block, Block 0. During block 810*c*, the layered decoder 600 performs a first iteration (Iteration 0) of the third layer (Layer 2) of the H-matrix parity checks on Block 0. Block 810*d* represents first Iteration 0 decoding process of the fourth through the penultimate layers of the H-matrix parity checks on the first code block, Block 0. Next, during block 810*e*, the layered decoder 600 performs a first iteration (Iteration 0) of the last layer (Layer M) of the H-matrix parity checks on Block 0. That is, the H-matrix includes layers 0 through M, where M is a positive integer.

After the first iteration of the decoding process of Block 0 is complete for all of the H-matrix layers, the second iteration decoding of Block 0 begins for the 0 through M layers of the H-matrix. During block 820*a*, the layer decoder 600 performs a second iteration (Iteration 1) of the first Layer 0 of the H-matrix on the first code block, Block 0. During block 820*b*, the layer decoder 600 performs a second iteration (Iteration 1) of the second Layer 1 of the H-matrix on Block 0. During block 820*c*, the layer decoder 600 performs a second iteration (Iteration 1) of the third Layer 2 of the H-matrix on Block 0. Block 820*d* represents the second iteration (Iteration 1) of the fourth through the M-1 Layers of the H-matrix processes that the layer decoder 600 performs on Block 0. During block 820*e*, the layer decoder 600 performs a second iteration (Iteration 1) of the last Layer M of the H-matrix on Block 0.

After the second iteration of the decoding process is complete for all of the layers of Block 1, the layer decoder 600 continues to perform the subsequent iterations of the layered decoding process, Iteration 2 through Iteration J-1. That is, Iteration J is the last iteration of the layered decoding process before convergence for Block 0. During Block 830*a*, the layer decoder 600 performs a last iteration (Iteration J) of the first Layer 0 of the H-matrix on the first code block, Block 0. During block 830*b*, the layered decoder 600 performs a last iteration (Iteration J) on the second Layer 1 of the H-matrix on the first code block, Block 0. During block 830*c*, the layered decoder 600 performs a last iteration (Iteration J) of the third Layer 2 of the H-matrix on Block 0. Block 830*d* represents last iteration (Iteration J) decoding process of the fourth through the penultimate (M-1) layers of the H-matrix on the first code block, Block 0. Next, during block 830*e*, the layered decoder 600 performs a last iteration (Iteration J) of the last Layer M of the H-matrix on Block 0.

After the decoding process is complete for Block 0, Block 1 Decoding 850*b* begins for processing the second code block, Block 1. During the time period of Block 1 Decoding 850*b*, the layered decoder 600 performs an iterative decoding process on Block 1. The layered decoder 600 begins with block 812*a*, processing Block 1 through the first iteration (Iteration 0) of the first Layer of the H-matrix. During blocks 812*b*-812*e*, the layered decoder 600 sequentially processes Block 1 through the first iteration (Iteration 0) of each subsequent layer (Layer 1 through Layer M) of the H-matrix. During blocks 822*a*-822*e*, the layered decoder 600 sequentially processes Block 1 through the second iteration (Iteration 1) of each layer (Layer 0 through Layer M) of the H-matrix. The layered decoder 600 continues to perform the subsequent iterations of the layered decoding process, Iteration 2 through Iteration J-1. That is, Iteration J is the last iteration of the layered decoding process before convergence for Block 1. The value of J for Block 1 can be a different value of J for Block 2.

After the penultimate (J-1) iteration of the decoding process of all of the layers of the H-matrix is complete for Block 1, the layer decoder 600 processes Block 1 through the last Iteration J of the layers (0-M) of the H-matrix. Next, a subsequent code block can be decoded according to the same method and process schedule.

Both the flooding and layered decoding methods present several design challenges. The logic cloud required to process an entire layer or entire H-matrix in a small number of cycles (preferably one cycle) will be large, and will create a long processing delay. The routing involved in connecting the VNs to the CNs is not well-suited to integrated circuit devices such as application-specific integrated circuits (ASICs) or field-programmable gate arrays (FPGAs). This routing congestion complicates the design and erodes the decoder throughput.

Figure 9:
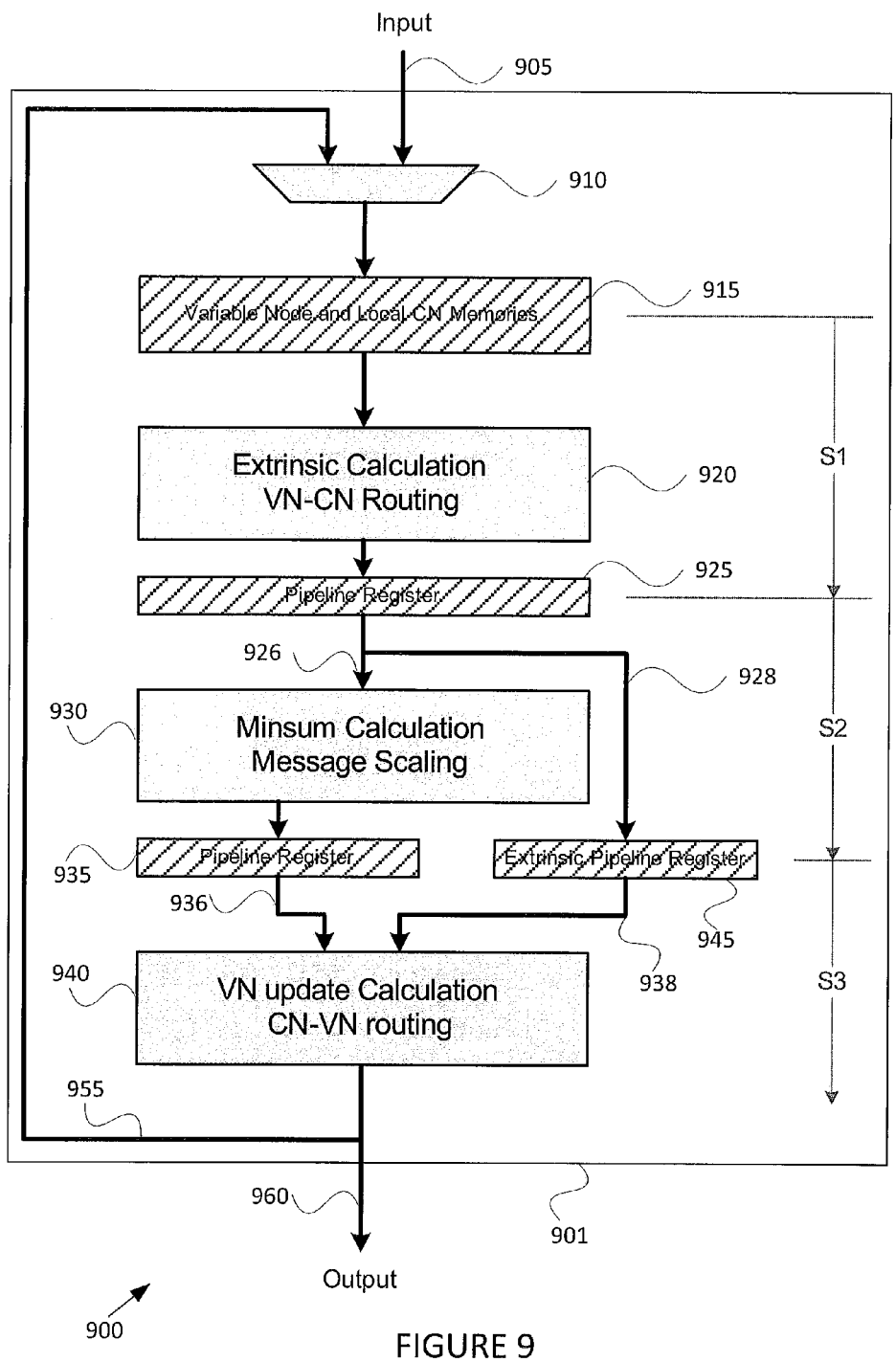
FIG. 9 illustrates a pipelined decoder implementing a decoding process according to embodiments of the present disclosure.

FIG. 9 illustrates a pipelined low density parity check (LDPC) decoding process 900 of a decoder 901 according to embodiments of the present disclosure. The embodiment of the decoder 901 and the pipelined LDPC decoding process 900 shown in FIG. 9 is for illustration only. Other embodiments could be used without departing from the scope of this disclosure.

In certain embodiments, the pipelined LDPC decoding process 900 includes a design better suited to current design methods and integrated circuit technologies. The pipelined LDPC decoder 900 comprises a design that uses hardware pipelining. The several steps of the decoding process are divided into multiple stages. For example, the six steps of block 640 are divided into three stages S1-S3, with two steps per stage. Although certain details will be provided with reference to the components of the decoder 901, it should be understood that other embodiments may include more, less, or different components.

The decoder 901 includes an input terminal 905 for receiving encoded code blocks, combinatorial logic block (such as multiplexer) 910, variable node and local check node memories 915, a first stage combinatorial logic block (such as decoding processing circuitry) 920, a second stage combinatorial logic block such as decoding processing circuitry) 930, a third stage combinatorial logic block such as decoding processing circuitry) 940, and a plurality of pipeline registers 925, 935, and including extrinsic pipeline register 945. The hatched blocks 915, 925, 935, 945 represent the sets of memory or register elements. The decoder 901 can be a layered decoder or a flooding decoder.

A decoder 901 receives a one or more encoded code blocks into the multiplexer 910. The multiplexer 910 sends a portion of the encoded code blocks to the variable node and local check node memories 915. The variable node and local check node memories 915 store the code blocks in a queue.

During the first stage S1, the first stage combinatorial logic block 920 sequentially receives the code block to be decoded from the variable node and local check node memories 915. When the decoder 901 is a layered decoder, a layer is the portion of the H-matrix processed by the first stage combinatorial logic block 920. When the decoder 901 is a flooding decoder, the entire H-matrix is processed by combinatorial logic block 920. The first stage combinatorial logic block 920 performs at least one decoding step on the received code block. For example, the first stage combinatorial logic block 920 performs two steps: Extrinsic Calculation; and VN-CN Routing. Then, the first stage combinatorial logic block 920 sends the partially processed code block to pipeline register 925.

During the second stage S2, the second stage combinatorial logic block 930 sequentially receives the partially processed code block to be decoded from the pipeline register 925 via communication 926. Simultaneously, the extrinsic pipeline register 945 receives extrinsic information for the partially processed code block to be decoded from the pipeline register 925 via communication 928. That is, the partially processed code block received from pipeline register 925 by the second stage S2 is routed to both second stage combinatorial block 930 and extrinsic pipeline register 945. The second stage combinatorial logic block 930 performs at least one decoding step on the partially processed code block. For example, the second stage combinatorial logic block 930 performs two steps: Minsum Calculation; and Message Scaling. Then, the second stage combinatorial logic block 930 sends the partially processed code block to pipeline register 935 via transmit path 932.

In certain embodiments, the pipeline register between S2 and S3 includes of two sets of registers 935 and 945. The second register 945 stores the extrinsic values from S1 for later use in S3. In certain embodiments, the second register 945, labeled as 'Extrinsic Pipeline Register' is required, depending on the design, the number of pipeline stages, and where the processing is divided by pipelining. If several pipeline stages are implemented within the CN processing, more than one pipeline stage may require secondary 'Extrinsic' Registers. In alternative embodiments, the second register 945 is optional.

During the third stage S3, the third stage combinatorial logic block 940 sequentially receives partially processed code block to be decoded from the pipeline register 935 via transmit path 936. Simultaneously, the third stage combinatorial logic block 940 sequentially receives the extrinsic information for the partially processed code block to be decoded from the extrinsic pipeline register 945 via transmit path 938. The third stage combinatorial logic block 940 performs at least one decoding step on the partially processed code block using the extrinsic information. For example, the third stage combinatorial logic block 940 performs two steps: VN Update Calculation; and CN-VN Routing. Then, the third stage combinatorial logic block 940 determines whether the iterative decoding process has converged. If convergence has not occurred, then the third stage combinatorial logic block 940 sends the decoded partially processed code block to the combinatorial logic block 910 via feedback transmit path 955. Upon convergence, the third stage combinatorial logic block 940 sends the decoded portion of the code block to the output terminal of the decoder 901 via transmit path 960.

Because of the feedback previously discussed, pipelining offers little time saving benefit to single-cycle flooding-schedule or layered-schedule LDPC decoders. Because each iteration (or layer) uses results from prior iterations/layers, each iteration (or layer) must be processed to completion before the next iteration or layer calculation can begin. When pipelining is implemented, clock frequency can be increased, but also the number of clock cycles required to complete each iteration or layer is proportionally increased.

Figure 10:
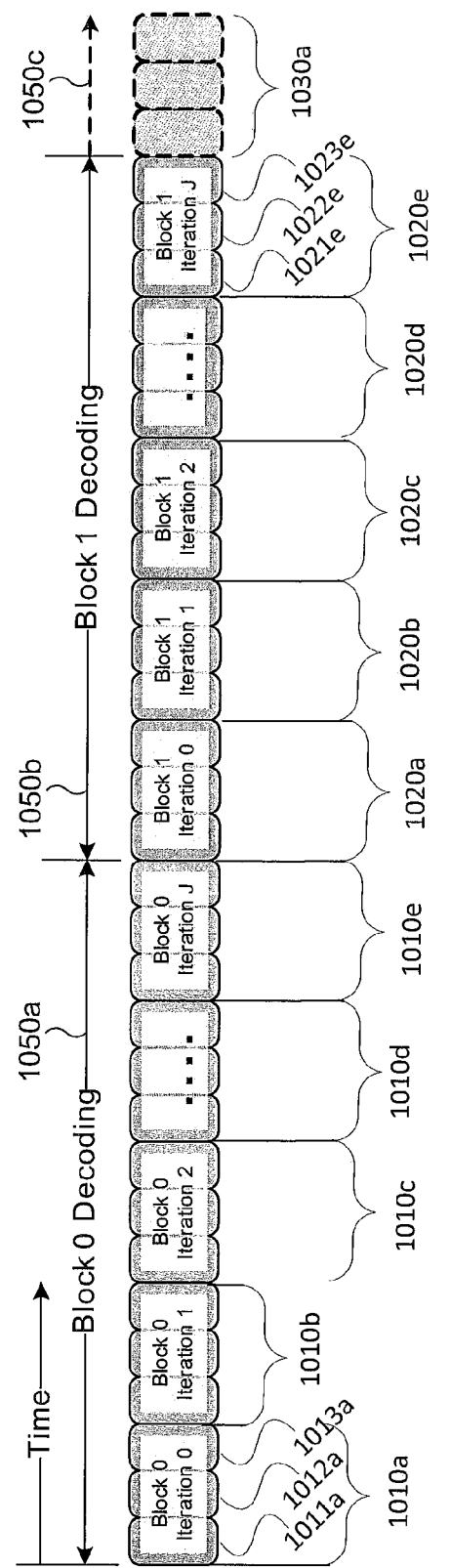
FIG. 10 illustrates a pipelined low density parity check (LDPC) decoding process of a decoder according to embodiments of the present disclosure.

FIG. 10 illustrates a pipelined iterative processing schedule 1000 of a decoder 901. The embodiment of the pipelined iterative processing schedule 1000 shown in FIG. 10 is for illustration only. Other embodiments could be used without departing from the scope of this disclosure.

Decoder 901 can be a flooding decoder that implements the pipeline LDPC decoding process 900 according to the pipelined iterative processing schedule 1000. For the decoder 901, each cycle (horizontal axis block) is 1/S or 1/3 of the original cycle period for the decoder 600. However, the decoder 901 takes S cycles (3 cycles) to complete each iteration.

Block 0 Decoding 1050$a$ represents the time to complete the pipeline LDPC decoding process 900 for the first code block, Block 0. During Block 0 Decoding 1050$a$, the decoder 901 processes Block 0 through multiple iterations, Iteration 0 through Iteration J. Block 1 Decoding 1050$b$ represents the time to complete the pipeline LDPC decoding process 900 for the second code block, Block 1. During Block 1 Decoding 1050$b$, the decoder 901 processes Block 1 through multiple iterations, Iteration 0 through Iteration J. Block 2 Decoding 1050$c$ represents the time to complete the pipeline LDPC decoding process 900 for a subsequent-third code block, Block 2. During Block 2 Decoding 1050$c$, the decoder 901 processes Block 2 through multiple iterations, Iteration 0 through Iteration J. The values of J can be different value for each of Block 0, Block 1, Block 2, and any subsequent code block.

Each block of time 1010a-1010e, 1020a-1020e, 1030a on the horizontal axis represents the time to process one decoding iteration. Each block of time for an iteration, such as 1010a, includes plurality of corresponding sub-blocks 1011a-1013a. Each sub-block 1011-1013 represents the time to process one stage S1-S3 of the pipeline LDPC decoding process 900. That is, sub-block 1011a represents the time to process Block 0 through the first stage S1 of the first Iteration 0. Sub-block 1012a represents the time to process Block 0 through the second stage S2 of the first Iteration 0. Sub-block 1013a represents the time to process Block 0 through the third stage S3 of the first Iteration 0. Similarly, toward the end of Block 1 Decoding 1050b, sub-block 1021e represents the time to process the second code block, Block 1, through the first stage S1 of the last Iteration J. Sub-block 1022e represents the time to process Block 1 through the second stage S2 of the last Iteration J. Sub-block 1023e represents the time to process Block 1 through the third stage S3 of the last Iteration J.

As a particular comparative example, consider a layered decoder where the calculations for one layer take 30 ns to complete with no pipelining. Pipeline registers 915, 925, 935, 945 can be added to the decoder to divide the processing of each layer into three stages, S1, S2, and S3, as shown in FIG. 9. In the best-case scenario, each stage will take 10 ns to complete, and therefore the overall decoder clock frequency can be tripled. However, since all three stages must execute and complete before the next layer can begin, three clock cycles will elapse for each layer. The resulting calculation therefore takes 3×10 ns, or 30 ns, the same as the non-pipelined configuration.

The pipelined design of the decoder 900 may be worse than the non-pipelined design of the decoder 600, for several reasons. First, when pipeline registers 915, 925, 935, 945 are added, the amount of hardware required for the decoder increases. Second, in real hardware it will be impossible to split the processing perfectly and evenly into three 10 ns stages. For example, in a real design the stages S1, S2, and S3 could have path delays of 10 ns, 8 ns, and 12 ns respectively. Finally, the pipeline registers themselves will add a small amount of additional delay for routing and clock-to-output delay, as well as requiring setup and hold time constraints to be met. In this example, the delay for the three stages could grow to 11 ns, 9 ns, and 13 ns. Because the clock period of the decoder must allow for the longest stage, the clock period would increase to 13 ns, and the three clock cycles required to process one layer now take 39 ns instead of 30 ns for the non-pipelined approach.

The process and the math are slightly different for layered or flooding decoders, but in both cases the process is iterative and uses feedback.

Figure 11:
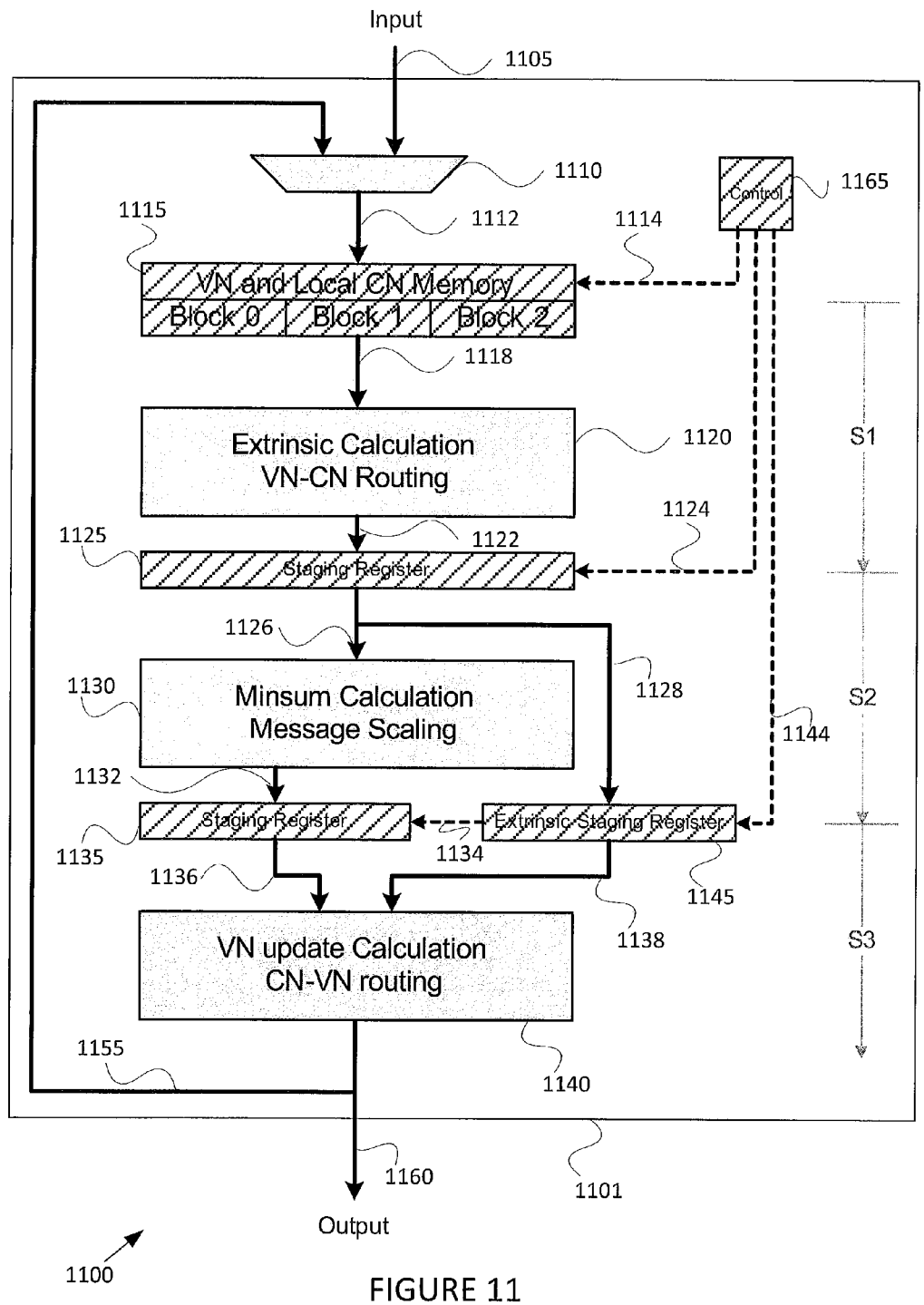
FIG. 11 illustrates a multi-stage time-division-multiplexed (MSTDM) decoder including an integrated input and working code block memory according to embodiments of the present disclosure.

FIG. 11 illustrates a multi-stage time-division-multiplexed (MSTDM) low density parity check (LDPC) decoding process 1100 of a decoder 1101 including an integrated input and working code block memory according to an exemplary embodiment of this disclosure. The embodiments of the MSTDM LDPC decoder 1101 and MSTDM LDPC decoding process 1100 shown in FIG. 11 are for illustration only. Other embodiments could be used without departing from the scope of this disclosure.

Embodiments of the present disclosure provide a MSTDM LDPC decoder that improves throughput by dividing the LDPC decoding into stages, and sequencing code blocks through the stages in a time-division multiplexed (TDM) manner. The number of stages, S can be 2, 3, or more. In certain embodiments, each stage of the MSTDM decoder 1101 processes a different code block. Thus, the decoder 1101 is capable of, and configured to, process up to S code blocks simultaneously.

In certain embodiments, the LDPC processing path is divided into stages. Control logic is also implemented that accesses the VN data from different code blocks in the correct sequence. This logic controls the read and write access to the VNs. The control logic also allows for processing any number of code blocks fewer than S, which is useful in cases where code blocks are not received fast enough to keep the decoder operating at all times on S blocks. This avoids excess decoding latency when code blocks are arriving at a lower than maximal rate. In these cases, the control logic also holds idle stages in a non-switching mode to reduce power consumption. That is, when the number of code blocks processed is less than the number S of processing stages or when one code word has completed processing but other code blocks are still being processed, the control logic prevents switching of decoder logic in any stage when idle. Although the example in FIG. 11 uses three stages, embodiments of the MSTDM decoder 1101 can include any number of stages (S≥2) without departing from the scope of this disclosure. Embodiments of the present disclosure are not limited to any specific division of the processing into stages. The divisions shown in FIG. 11 are only one example. The optimum division of the processing stages will be design dependent, and the exact methods used to balance the path delays of the different stages are beyond the scope of this discussion.

The MSTDM LDPC decoder 1101 includes an input terminal for receiving encoded code blocks via transmit path 1105, multiplexer 1110, integrated memory 1115, a first stage decoder processing circuitry 1120, a second stage decoder processing circuitry 1130, a third stage decoder processing circuitry 1140, and a plurality of staging registers 1125, 1135, and including extrinsic staging register 1145. The decoder 1101 includes a controller 1165. Controller 1165 includes processing circuitry that sends control signals to the integrated memory 1115 via communication line 1114, to staging register 1125 via communication line 1124, to staging register 1135 via communication line 1134, and to Extrinsic Staging Register 1145 via communication line 1144. The hatched blocks 1115, 1125, 1135, 1145 represent the sets of memory or register elements. In certain embodiments, the decoder 1101 is a layered decoder. In certain embodiments, the decoder 1101 is a flooding decoder. In certain embodiments, one or more of the memories and decoder processing circuitry (combinatorial logic elements) of the MSTDM LDPC decoder 1101 are similar to, or the same as, the memories and decoder processing circuitry (combinatorial logic elements) of the pipeline decoder 901.

The integrated memory 1115 includes variable node and local check node memories, input and working code block memory of the decoder 1101. When the decoder 1101 performs a three stage MSTDM LDPC decoding process, the integrated memory 1115 stores the three code blocks that the decoder 1101 simultaneously processes. During operation, while the decoder 1101 is simultaneously processing three code blocks, the first code block is stored in Block 0, the second code block is stored in Block 1, and the third code block is stored in Block 2.

The clock frequency of the MSTDM LDPC decoder 1101 is approximately 3 times to 3.2 times that of the single-stage full-row decoder 600. (For reasons previously discussed, the clock rate may be a little less than 3 times the original clock rate).

Figure 13:
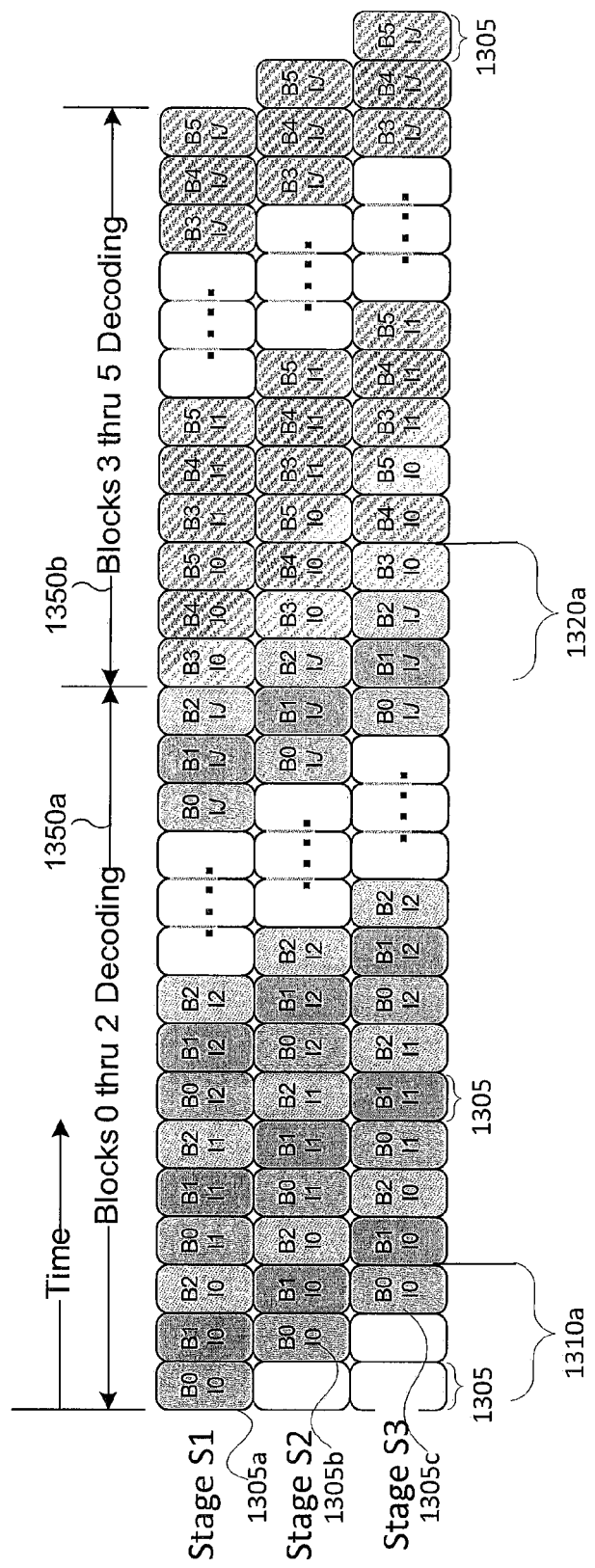
FIG. 13 illustrates a pipelined iterative processing schedule of a three stage MSTDM decoder processing three code blocks according to embodiments of the present disclosure.

Latency for each code block is virtually unchanged. That is, each block is processed in the same amount of time as the single-stage decoder 600. However, during the passage of equal time, 3 times as many code blocks are processed in the MSTDM LDPC decoder 1101 as compared to the single-stage decoder 600. Thus, the throughput approaches 3 times that of the single-stage decoder 600. This is true for both flooding and layered schedule decoders. FIG. 13 illustrates a flooding processing schedule. However, it can be easily shown that the same approach can apply to a layered processing schedule, where each stage processes a partial-layer of one code block per cycle instead of a partial-iteration of one code block.

For the generalized MSTDM case with S stages, the following characteristics are observed: Clock frequency is increased by approximately S; Latency is essentially unchanged; Throughput is increased by approximately S; Memory or register hardware increases proportional to S, but CN processing hardware remains constant.

Compared with the single-stage full-row decoder, the only hardware added is registers (memory) and some very small control logic (processing circuitry). The amount of decoder processing circuitry (for extrinsic calculation, VN-CN routing, minsum calculation, message scaling, VN update calculation, CN-VN routing) is the same as for the single-stage decoder, though in the MSTDM LDPC decoder 1101 the decoder processing circuitry is segmented into S stages.

Figure 12:
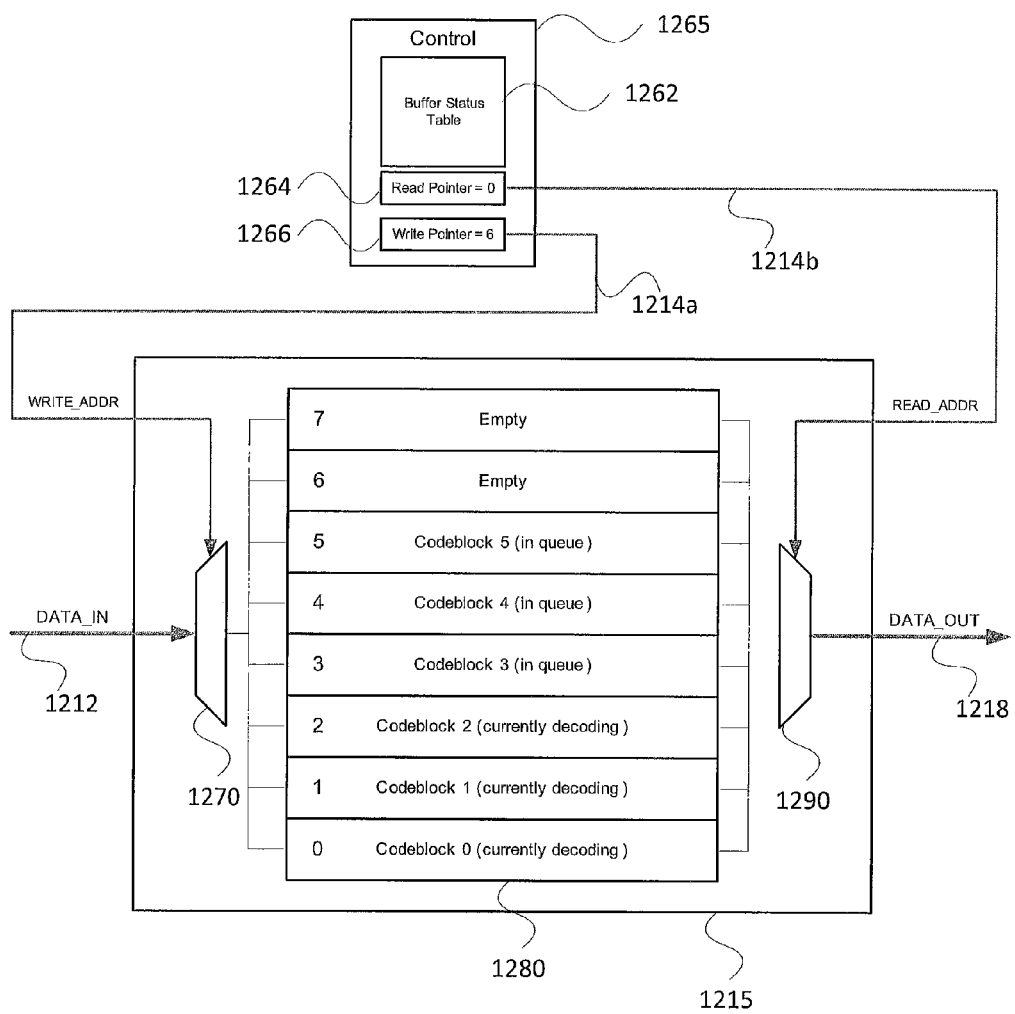
FIG. 12 illustrates the integrated input and working code block memory of a MSTDM decoder according to embodiments of the present disclosure.

The controller 1165 circuitry added to the design is quite small compared with the processing circuitry in the decoder 1101. In terms of hardware size, the staging registers 1125, 1135, 1145 are a more significant addition. Additional memory is required to hold S blocks of data, compared to memory for 1 block of data in the single-stage decoder 600. The additional memory does not necessarily represent an increase in hardware. Typically, a decoder will implement input and output buffers to absorb data bursts but maintain high average throughput. These buffers hold several code blocks, for example, a dozen code blocks or more. In certain embodiments of the MSTDM LDPC decoder 1101, the input buffer and the working buffer are one and the same. As an example, an input buffer capable of holding 8 code blocks could also be the working buffer for a 3-stage MSTDM decoder as shown in FIG. 12. The controller 1165 keeps track of the input buffers to determine which blocks are being processed by the decoder, which have completed processing and should be sent to output, and which are empty locations available for newly arriving code blocks.

The increase in hardware size represented by the staging registers depends on the specific code being implemented, the number of stages being implemented, and other details of the decoder design. In one embodiment, a code includes a column weight wc, and a layered decoder with local-row CN memory equal to column weight. Certain decoder designs contain 1+wc registers (one register for the VNs and a number of local CN registers equal to wc). The MSTDM decoder 1101 contains S staging registers, plus a number of local CN registers equal to wc, plus possible secondary Extrinsic registers 1145 as illustrated herein above. In certain embodiments, when the number of secondary Extrinsic registers 1145 is equal to S-1, the MSTDM decoder contains 2S-2+wc registers. In certain embodiments, all registers use the same bit precision and therefore are the same size. Therefore, the ratio R of the registers in an MSTDM decoder to the registers in a another type of decoder (for example, a single stage decoder) is approximated as follows:

$$R \cong \frac{2S - 2 + w_C}{1 + w_C} \quad \text{[Eqn. 1]}$$

Table 1 (below) contains examples of R for different values of S and $w_c$.

TABLE 1

Values of R for different $w_c$ and S

| Column Weight ($w_c$) | Number of Stages (S) | Number of Registers relative to non-MSTDM decoder (R) |
|---|---|---|
| 4 | 3 | 1.60x |
| 6 | 3 | 1.43x |
| 10 | 4 | 1.45x |

In other decoder designs (for example, single stage decoder designs), the registers and memory represent approximately 25% of the overall hardware and power consumption of the decoder. Therefore, the added registers or memory to implement the MSTDM LDPC method 1100 represent only a modest increase in hardware area (silicon die area). For example, if memory elements represent 25% of the decoder and R is 1.6x, the overall MSTDM LDPC decoder 1101 size increase is 15%.

The power consumption of the MSTDM LDPC decoder 1101 increases in proportion to the additional memory elements. The increased clock frequency will increase total power consumption, but on a power-per-decoded-bit basis, the increased clock frequency is offset by the greater number of bits decoded. For example, if clock frequency increases by a factor of 3, throughput also increases by a factor of 3. Power-per-decoded-bit is therefore unaffected by clock rate. The only power increase per decoded bit will be in proportion to the increased number of registers (approximately 15% using the previous example).

FIG. 12 illustrates an integrated input and working code block memory of a MSTDM decoder according to embodiments of this disclosure. The embodiment of the integrated input and working code block memory shown in FIG. 12 is for illustration only. Other embodiments could be used without departing from the scope of this disclosure.

Controller 1265 can be the same as, or similar to, controller 1165. The integrated input and working code block memory 1215 can be the same as, or similar to, the input and working code block memory of the integrated memory 1115. The communication link 1214 can be the same as, or similar to, the communication link 1114; and the communication link 1218 can be the same as, or similar to, the communication link 1118. As such, controller 1265 is coupled to and sends control signals to the integrated memory 1215 via the communication link 1214. The communication link 1214 includes a write path 1214*a* and a read path 1214*b*.

The integrated memory 1215 includes a de-multiplexer 1270, a register 1280, and a multiplexer 1290. The de-multiplexer 1270 includes an input terminal for receiving fully encoded or partially decoded code blocks via path 1212. The de-multiplexer 1270 receives control signals from the write pointer 1266 of the control 1265 instructing the de-multiplexer 1270 to store the DATA_IN at a specified address within the register 1280. For example, the de-multiplexer 1270 receives Codeblock 6 as the DATA_IN via path 1212 and receives a WRITE_ADDR instruction signal from the controller 1265 via the communication link 1214a. The WRITE_ADDR instruction signal instructs the de-multiplexer 1270 to store Codeblock 6 at the address 6, as indicated by the value of the Write Pointer 1266. In response to the WRITE_ADDR instruction signal, the de-multiplexer 1270 stores the Codeblock 6 at address 6 within the register 1280.

The register 1280 includes one or more uniquely addressable registers. For example, the register 1280 includes 8 addressable register locations. In the register 1280, for example, addresses 0, 1, and 2 of the integrated memory contain the code blocks currently being processed by the decoder; addresses 3, 4, and 5 contain code blocks that have been received, but are waiting in the queue to be processed; and addresses 6 and 7 are empty (possibly containing code blocks which have already been decoded and output) and are ready to receive newly arrived code blocks. The controller 1265 maintains the status of each register address so that it is used appropriately. The register 1280 includes a separate storage location for each number of stages of the MSTDM LDPC decoding process 1100. For example, when the MSTDM LDPC decoding process 1100 includes three stages S1-S3, the register 1280 includes three register addresses assigned a currently decoding status for storing the code blocks to be concurrently decoded according to the MSTDM LDPC decoding process 1100. The register 1280 includes storage locations for storing code blocks in queue. That is, during operation, while Code blocks 0, 1, and 2 are being currently decoded, the register 1280 stores Code blocks 3, 4, and 5, to be decoded next. If the register receives a Codeblock 6 while the register contains Code blocks 0-5 in register addresses 0-5, then Codeblock 6 will be stored in a storage location with an empty status, such as storage locations 6 or 7.

The multiplexer 1290, includes an output terminal for sending fully encoded or partially decoded code blocks via path 1218 to a first stage combinatorial block, such as decoder processing circuitry 1120. The multiplexer 1290 receives control signals from the read pointer 1264 of the controller 1265. The control signals from the read pointer 1264 instruct the multiplexer 1290 to retrieve the information stored at a specified address within the register 1280 and to and output the specified stored information as the DATA_OUT via path 1218. For example, the multiplexer 1290 receives a READ_ADDR instruction signal from the control 1265 via the transmit path 1214b. The READ_ADDR instruction signal instructs the multiplexer 1290 to read the address 0, as indicated by the value of the Read Pointer 1264. In response to the READ_ADDR instruction signal, the multiplexer 1290 retrieves the Codeblock 0 at address 0 within the register 1280 and sends Codeblock 0 as the DATA_OUT via path 1218.

The controller 1265 includes a Buffer Status Table 1262, a read pointer 1264, and a write pointer 1266. The read pointer 1264 indicates the register address of the information to be output via the path 1218. The write pointer 1266 indicates the register address to store information input via the path 1212. The Buffer Status Table 1262 contains a record of each code block stored at each address within the register 1280. For each address within the register 1280, the Buffer Status Table 1262 contains a record of the status, such as a currently decoding status, in queue status, and empty status.

FIG. 13 illustrates a pipelined iterative processing schedule 1300 of a three stage MSTDM LDPC decoder 1101 processing three code blocks according to embodiments of the present disclosure. The embodiment of the pipelined iterative processing schedule 1300 shown in FIG. 13 is for illustration only. Other embodiments could be used without departing from the scope of this disclosure.

For each block in the FIG. 13, Bn Im refers to iteration m of code block n is being processed at that time slot in that particular stage. In this example, each code block is processed for J iterations.

Each column 1305 of blocks on the horizontal axis represents the length of time to process one decoding stage S1-S3 of the MSTDM LDPC decoding process 1100. Each block within a column represents the time to process a code block through a corresponding stage. For example, block 1305a represents the time to process Block 0 through the first stage S1 of the first Iteration 0. Block 1305b represents the time to process Block 0 through the second stage S2 of the first Iteration 0. Block 1305c represents the time to process Block 0 through the third stage S3 of the first Iteration 0. In the first column 1305 of the time period 1350a of Blocks 0 thru 2 Decoding, the two blocks beneath block 1305a are empty because no code block precedes Block 0—the combinatorial logic 1130 and 1140 for stages 2-3 are idle during this time. Likewise, in the second column 1305 of the time period 1350a, the one bottom block is empty because no code block precedes Block 0—the combinatorial logic 1140 for stage 3 is idle during this time. Compared to the first column of the Blocks 0 thru 2 Decoding time period 1350a, the fourth column 1305 of the same time period 1350a does not include any empty blocks. During the time of the fourth column 1305 of the timer period 1350a, the decoder 1101 processes Block 0 through the first stage S1 of the second Iteration 1. At the same time, the decoder 1101 continues processing Block 1 and Block 2 through the first Iteration 0, through the third stage S3 and the second stage S2, respectively.

During the Block 0 thru 2 Decoding time period 1350a, the MSTDM LDPC decoder 1101 performs an iterative decoding process 1100 on three code blocks: Block 0, Block 1, and Block 2. At the beginning of the Block 3 thru 5 Decoding time period 1350b, the MSTDM LDPC decoder 1101 completes Stage 3 of the decoding process 1100 for Block 1 and completes Stages 2 and 3 of the decoding process 1100 for Block 2. During the time period 1350b, the MSTDM LDPC decoder 1101 performs in iterative decoding process 1100 on three code blocks: Block 3, Block 4, and Block 5.

During the time period 1350a, the decoder 1101 processes a first Block 0 through J iterations of S stages per iteration. The decoder 1101 processes a second Block 1 through J iterations, however, when the first Block 0 completes the last stage of Iteration J, the second Block 1 completes the penultimate stage (also referred to as second-to last stage). For example, in a three stage MSTDM LDPC decoding process 1100, Block 1 completes the second Stage S2 during the time period 1350a. The decoder 1101 processes a third Block 2 through J iterations, however, when the first Block 0 completes the last stage of Iteration J, the third Block 2 completes the S-2 stage. For example, in a three stage MSTDM LDPC decoding process 1100, Block 2 completes the first Stage S1 during the time period 1350a.

Next, during the first column 1305 of the Blocks 3 thru 5 Decoding time period 1350b, while the decoder 1101 processes a fourth code block, Block 3, through the first stage S1 of a first Iteration 0, the decoder 1101 also continues processing Block 1 and Block 2 through the last Iteration J. That is, during the first column 1305 of the Blocks 3 thru 5 Decoding time period 1350b, decoder 1101 processes Block 1 through the last stage S3 and processes Block 2 through the second stage S2 of Iteration J. Likewise, during the second column 1305 of the Blocks 3 thru 5 Decoding time period 1350b, while the decoder 1101 processes Block 3 through the second stage of a first Iteration 0, the decoder 1101 processes the Block 2 through the last stage S3 of Iteration J.

The length of time period 1310a for the decoder 1101 to process Block 0 through S stages of one iteration is the substantially the same as the length of time period 1010a for the decoder 901 to process Block 0 through S stages of one iteration. Also, the length of time period 1310a is substantially the same as the length of time period 710a for the decoder 600 to process Block 0 through the single stage of one iteration. The length of time period 1320a for the decoder 1101 to process Block 3 through S stages of one iteration is substantially the same length of time as periods 710a, 1010a, and 1310a.

The time period to complete a decoding process of J iterations processing Block 0 is substantially the same for the single-stage decoder 600, the pipeline decoder 901, and the MSTDM LDPC decoder 1101. That is, the time period 1350a of Block 0-2 Decoding is substantially the same as the time period 1050a of Block 0 Decoding and the time period 750a of Block 0 Decoding.

Figure 14:
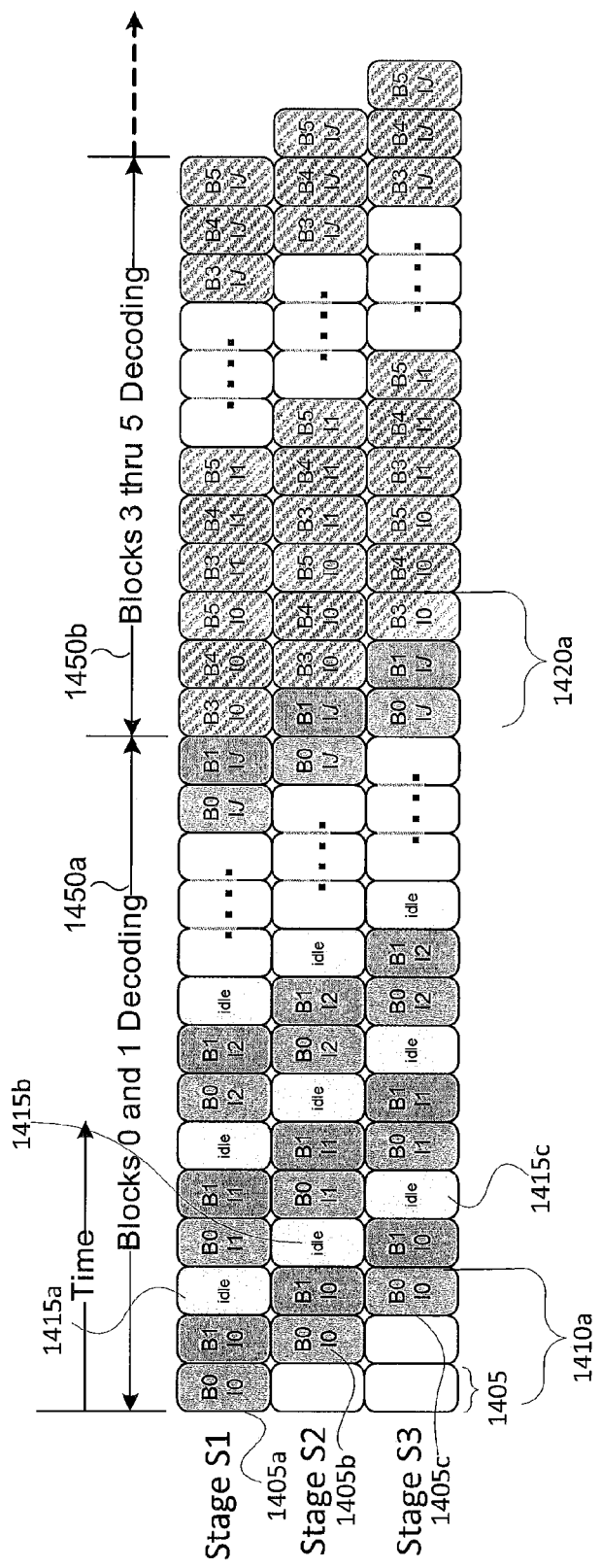
FIG. 14 illustrates a pipelined iterative processing schedule of a three stage MSTDM decoder processing two code blocks according to embodiments of the present disclosure.

FIG. 14 illustrates a pipelined iterative processing schedule of a three stage MSTDM decoder processing two code blocks according to an exemplary embodiment of this disclosure. The embodiment of the pipelined iterative processing schedule shown in FIG. 14 is for illustration only. Other embodiments could be used without departing from the scope of this disclosure.

As previously described, the MSTDM LDPC decoder 1101 controller 1165 is capable of processing fewer than S code blocks at times when data is not arriving at a sufficient rate yet latency must be maintained. In this mode, the controller 1165 holds the idle stages 1415a-c in a low-power non-switching state. As an example, FIG. 14 shows the processing schedule 1400 for a 3-stage MSTDM LDPC decoder 1101 operating on two code blocks during the first decoding period 1450a ("Blocks 0 and 1 Decoding"), and then operating on 3 code blocks in the subsequent decoding period 1450b ("Blocks 3 thru 5 Decoding"). During the time period 1450a, the decoder 1101 processes a first Block 0 through J iterations of S stages per iteration, however, the time period 1450a ends when the last stage completes an idle block 1415 in the penultimate Iteration J-1. The decoder 1101 processes a second Block 1 through J iterations, however, when the first Block 0 completes the penultimate stage of Iteration J, the second Block 1 completes the antepenultimate stage (also referred to as third-to last stage or S-2 stage). For example, in a three stage MSTDM LDPC decoding process 1100, Block 0 completes the third stage S3 during the time period 1450b, Block 1 completes the second Stage S2 and the third stage S3 during the time period 1450b. During the time period 1450b, the decoder processes a third Block 3 through J iterations of S stages per iteration. The decoder 1101 processes a fourth Block 4 through J iterations, however, when the third Block 3 completes the last stage of Iteration J, the fourth Block 4 completes the penultimate stage S2 of Iteration J. The decoder 1101 processes a fifth Block 5 through J iterations, however, when the third Block 3 completes the last stage of Iteration J, the fifth Block 5 completes the antepenultimate (also referred to as "third-to-last") stage of Iteration J.

In certain embodiments, the controller 1165 is configured for lower power consumption when an early termination mode is used. In early termination mode, the decoding of some code blocks may converge in fewer iterations, while other simultaneously processed code blocks require more iterations. In this case, the MSTDM LDPC decoder 1101 continues to process the non-converged code blocks while preserving the log-likelihood ratio (LLR) values for converged code blocks in VN Memory. Stages which are no longer being used to process the converged code blocks are held in a low-power non-switching state, such as an idle state 1415a-c.

Each column 1405 of blocks on the horizontal axis represents the length of time to process one decoding stage S1-S3 of the MSTDM LDPC decoding process 1100. Each block within a column represents the time to process a code block through a corresponding stage. The length of time period 1410a represents the time for the decoder 1101 to process Block 0 through S stages of one iteration. The length of time period 1410a is substantially the same as the length of time of time period 710a, 1010a, 1310a, or 1320a. The length of time period 1420a for the decoder 1101 to process Block 3 through S stages of one iteration is substantially the same length of time period 1410a.

As a specific example, the MSTDM LDPC decoder 1101 processes two code blocks (namely, Block 0 and Block 1) through three stages S1-S3 and through J iterations. According to this specific example, S=3 stages. In the first column 1405 of the time period 1410a, block 1405a represents the time to process Block 0 through the first stage S1 of the first Iteration 0. In the second column 1405 of the time period 1410a, block 1405b represents the time to process Block 0 through the second stage S2 of the first Iteration 0. In the third column 1405 of the time period 1410a, block 1405c represents the time to process Block 0 through the third stage S3 of the first Iteration 0. In the first column 1405 of the time period 1450a of Blocks 0 and 1 Decoding, which is also the first column 1405 of the time period 1410a, the two blocks beneath block 1405a are empty because no code block precedes Block 0—the combinatorial logic 1130 and 1140 for stages 2-3 are idle during this time. Likewise, in the second column 1405 of the time period 1450a, which is also the second column 1405 of the time period 1410a, the one bottom block beneath block 1405b is empty because no code block precedes Block 0—the combinatorial logic 1140 for stage S3 is idle during this time. In the third column 1405 of the time period 1450a, which is also the third column 1405 of the time period 1410a, the top block is an idle block 1415a because no code block immediately follows Block 1—the combinatorial logic 1120 for stage S1 is not used and is idle during this time. That is, the combinatorial logic 1120 is not processing a code block and is not consuming the amount of power necessary to process a code block during the third column of the time period 1410a. In the fourth column 1405 of the time period 1450a, the decoder 1101 processes Block 0 through stage S1 of Iteration 1 in the top block; the middle block is an idle block 1415b and is saving power because no code block is processed immediately following Block 1 in Iteration 0; and the decoder 1101 processes Block 1 through stage S3 of Iteration 0 in the bottom block. In the fifth column 1405 of the time period 1450a, the decoder 1101 processes Block 1 through stage S1 of Iteration 1 in the top block; the decoder 1101 processes Block 0 through stage S2 of Iteration 1 in the middle block; and the bottom block is an idle block 1415c and is saving power because no code block is processed immediately following Block 1 in Iteration 0. According to the schedule 1400, the decoder 1101 continues to process the code Blocks 0 and 1 according to the same sequence of the schedule 1300, but maintaining an idle block 1415a-c instead of processing a Block 2 through J iterations.

Also as a specific example, immediately after the decoding time period 1450a, the MSTDM LDPC decoder 1101 processes three code blocks (namely, Block 3, Block 4, and Block 5) through three stages S1-S3 and through J iterations. During the first column 1405 of the time period 1450b and time period 1420a, while the decoder 1101 processes a third code block, Block 3, through the first stage S1 of a first Iteration 0, the decoder 1101 also processes Block 0 through the last stage S3 of the last Iteration J and processes Block 1 through the penultimate stage S2 of the Last Iteration J. During the second column 1405 of the time period 1450*b* and time period 1420*a*, while the decoder 1101 processes a fourth code block, Block 4, through the first stage S1 of a first Iteration 0, the decoder 1101 simultaneously processes Block 3 through the second stage S2 of the first Iteration 0, and the decoder 1101 processes the Block 1 through the last stage S3 of the last Iteration J. During the third column 1405 of the time period 1420*a*, while the decoder 1101 processes a fifth code block, Block 5, through the first stage S1, the decoder 1101 also processes Block 4 through the second stages S2 and processes Block 3 through the third stage S3.

According to the specific examples above, the Blocks 3 through 5 Decoding period 1450*b* does not include any idle blocks 1415 because Block 3 replaced the idle stage that in decoding period 1450*a* immediately followed Block 1, and because the decoder 1101 processes. Block 4 immediately after processing Block 3 through the first stage S1 and processes Block 5 immediately after processing Block 3 through the second stage S2. That is, during the decoding period 1450*b*, the number of code blocks processed is the same as the number S of stages.

Embodiments of the present disclosure can be applied to LDPC decoder designs used in various systems, including wireless communication systems, wired communication systems, hard disk drives, and other data communication and storage systems.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A pipeline low density parity check (LDPC) decoder comprising:
   an input terminal configured to receive at least one code block;
   an input buffer memory configured to store the at least one code block; and
   processing circuitry comprising a plurality of LDPC decoding stages, each LDPC decoding stage configured to implement a respective portion of an LDPC decoding process, the processing circuitry configured to:
   process a number S of code blocks concurrently, and
   sequence the S code blocks through the plurality of LDPC decoding stages, wherein a first LDPC decoding stage is configured to process a first code block during a first time period and a second code block during a second time period and a second LDPC decoding stage is configured to process the first code block during the second time period
   wherein the pipeline LDPC decoder comprises a flooding decoder.

2. A pipeline low density parity check (LDPC) decoder comprising:
   an input terminal configured to receive at least one code block;
   an input buffer memory configured to store the at least one code block;
   processing circuitry comprising a plurality of LDPC decoding stages, each LDPC decoding stage configured to implement a respective portion of an LDPC decoding process, the processing circuitry configured to:
   process a number S of code blocks concurrently, and
   sequence the S code blocks through the plurality of LDPC decoding stages, wherein a first LDPC decoding stage is configured to process a first code block during a first time period and a second code block during a second time period and a second LDPC decoding stage is configured to process the first code block during the second time period; and
   an integrated memory comprising the input buffer memory, the variable node memory, and the local check node memory.

3. A pipeline low density parity check (LDPC) decoder comprising:
   an input terminal configured to receive at least one code block;
   an input buffer memory configured to store the at least one code block;
   processing circuitry comprising a plurality of LDPC decoding stages, each LDPC decoding stage configured to implement a respective portion of an LDPC decoding process, the processing circuitry configured to:
   process a number S of code blocks concurrently, and
   sequence the S code blocks through the plurality of LDPC decoding stages, wherein a first LDPC decoding stage is configured to process a first code block during a first time period and a second code block during a second time period and a second LDPC decoding stage is configured to process the first code block during the second time period; and
   a plurality of staging registers, each staging register coupled between a set of two of the LDPC decoding stages and configured to store a processed result of the first LDPC decoding stage and to provide the processed result of the first stage as input to the second LDPC decoding stage.

4. The decoder as set forth in claim 3, wherein at least one of the staging registers comprises a two sets of registers.

5. The decoder as set forth in claim 4, wherein the one of the two sets of registers comprise an extrinsic staging register configured to store extrinsic values from a LDPC decoding stage to be used in a subsequent LDPC decoding stage, wherein the subsequent LDPC decoding stage is different from an immediately following LDPC decoding stage.

6. The decoder as set forth in claim 1, wherein the plurality of LDPC decoding stages comprises at least three LDPC decoding stages.

7. A pipeline low density parity check (LDPC) decoder comprising:
   an input terminal configured to receive at least one code block;
   an input buffer memory configured to store the at least one code block; and
   processing circuitry comprising a plurality of LDPC decoding stages, each LDPC decoding stage configured to implement a respective portion of an LDPC decoding process, the processing circuitry configured to:
   process a number S of code blocks concurrently, and
   sequence the S code blocks through the plurality of LDPC decoding stages, wherein a first LDPC decoding stage is configured to process a first code block during a first time period and a second code block during a second time period and a second LDPC decoding stage is configured to process the first code block during the second time period,
   wherein the decoder comprises
   a layered decoder.

8. A multi-stage time-division multiplexed (MSTDM) low density parity check (LDPC) decoder comprising:
- an input terminal configured to receive at least one code block;
- an input buffer memory configured to store the at least one code block;
- a working memory configured to store the at least one decoding iteration of the at least one code block; and
- processing circuitry comprising a number S of LDPC decoding stages in a series, wherein each LDPC decoding stage is configured to implement one or more respective decoding steps, the processing circuitry configured to:
  - process S code blocks concurrently, and
  - sequence the S code blocks through the S LDPC decoding stages per iteration in a time-division multiplexed (TDM) manner, wherein a first LDPC decoding stage is configured to process a first code block during a first time period and a second code block during a second time period and a second LDPC decoding stage is configured to process the first code block during the second time period.

9. The decoder as set forth in claim 8, further comprising a time-division multiplexer.

10. The decoder as set forth in claim 8, wherein the processing circuitry is further configured to implement an Early Termination Mode.

11. The decoder as set forth in claim 8, further comprising an integrated memory comprising the input buffer memory, the variable node memory, and the local check node memory.

12. The decoder as set forth in claim 8, further comprising a plurality of staging registers, each staging register coupled between a set of two of the LDPC decoding stages and configured to store the at least one code block between the two LDPC decoding stages.

13. The decoder as set forth in claim 12, wherein at least one of the staging registers comprises a two sets of registers.

14. The decoder as set forth in claim 13, wherein the one of the two sets of registers comprise an extrinsic staging register configured to store extrinsic values from a LDPC decoding stage to be used in a subsequent LDPC decoding stage, wherein the subsequent LDPC decoding stage is different from an immediately following LDPC decoding stage.

15. The decoder as set forth in claim 8, wherein the plurality of LDPC decoders comprises at least three LDPC decoding stages.

16. The decoder as set forth in claim 8, wherein the decoder comprises one of:
- a flooding decoder; and
- a layered decoder.

17. The decoder as set forth in claim 8, wherein the at least one code block comprises fewer code blocks than the number S;
- and wherein the processing circuitry is further configured to, when a LDPC decoding stage is not currently processing a code block, hold the non-processing LDPC decoding stage in and idle state.

18. A method of decoding a low density parity check (LDPC) encoded code block, the method comprising:
- receiving at least one code block from a channel;
- storing the at least one code blocks in an input buffer memory;
- sequencing, by processing circuitry, the at least one code block through a series of a number S of LDPC decoding stages wherein a first LDPC decoding stage is configured to process a first code block during a first time period and a second code block during a second time period and a second LDPC decoding stage is configured to process the first code block during the second time period; and
- storing decoded iterations of the at least one code block in a register between two LDPC decoding stages.

19. The method as set forth in claim 18, further comprising storing the at least one received code block in a working memory during a decoding iteration of the at least one received code block.

20. The method as set forth in claim 19, wherein an integrated memory comprises the input buffer memory, the working memory, the variable node memory, and the local check node memory; and
- wherein storing the at least one received code block in an input buffer memory and storing the at least one received code block in a working memory comprise storing the at least one received code block in the same memory.

21. The method as set forth in claim 18, further comprising implementing an Early Termination Mode.

22. The method as set forth in claim 18, wherein the sequencing further comprises a time-division multiplexed (TDM) manner; and
- the method further comprising: simultaneously processing S different code blocks, each LDPC decoding stage processing a different code block than each other LDPC decoding stage.

23. The method as set forth in claim 18, wherein the at least one code block comprises fewer code blocks than the number S;
- and wherein the processing circuitry is further configured to, when a LDPC decoding stage is not currently processing a code block, hold the non-processing LDPC decoding stage in and idle state.

* * * * *